(12) United States Patent
Shibata et al.

(10) Patent No.: US 8,387,554 B2
(45) Date of Patent: Mar. 5, 2013

(54) COATING NOZZLE, COATING METHOD, AND INNER VOLUME CONTROL VALVE

(75) Inventors: Ryuichiro Shibata, Tokyo (JP); Yoshinori Suzuki, Tokyo (JP)

(73) Assignee: Nordson Corporation, Westlake, OH (US)

( * ) Notice: Subject to any disclaimer, the term of this patent is extended or adjusted under 35 U.S.C. 154(b) by 365 days.

(21) Appl. No.: 12/844,138

(22) Filed: Jul. 27, 2010

(65) Prior Publication Data

US 2011/0059257 A1    Mar. 10, 2011

(30) Foreign Application Priority Data

Aug. 6, 2009   (JP) ................. 2009-183451

(51) Int. Cl.
*B05B 5/00* (2006.01)
*B05C 3/02* (2006.01)

(52) U.S. Cl. ..... 118/300; 118/410; 239/553; 239/553.3; 239/553.5; 239/601

(58) Field of Classification Search ................. 118/300, 118/410, 411; 239/600, 601, 548–556, 562, 239/590.3, 291, 292, 293, 298, 299, 300; 156/578; 427/425, 427.3

See application file for complete search history.

(56) References Cited

U.S. PATENT DOCUMENTS

| | | | | |
|---|---|---|---|---|
| 4,774,109 | A * | 9/1988 | Hadzimihalis et al. | 427/286 |
| 5,354,378 | A * | 10/1994 | Hauser et al. | 118/696 |
| 5,636,790 | A * | 6/1997 | Brusko et al. | 239/124 |
| 2005/0205689 | A1 * | 9/2005 | Crane et al. | 239/290 |
| 2008/0145530 | A1 * | 6/2008 | Bondeson et al. | 427/207.1 |

* cited by examiner

*Primary Examiner* — Yewebdar Tadesse
(74) *Attorney, Agent, or Firm* — Wood, Herron & Evans, L.L.P.

(57) ABSTRACT

A coating nozzle includes a nozzle body including an inlet opening for receiving a liquid supplied from a liquid supply valve and an outlet opening, a distribution plate disposed adjacent to the nozzle body and including an elongated bore in fluid communication with the outlet opening, a shim plate disposed adjacent to the distribution plate and including a shim plate cutout communicating with the elongated bore of the distribution plate, and a baffle plate disposed adjacent to the shim plate. At least a portion of the shim plate cutout is located between the first elongated bore and the baffle plate so as to define a multi-face dispensing slot for dispensing the liquid onto at least two faces of the substrate.

13 Claims, 35 Drawing Sheets

(a)

(b)

(c)

COATING NOZZLE, COATING METHOD, AND INNER VOLUME CONTROL VALVE

TECHNICAL FIELD

The present invention relates to a coating nozzle and coating method that can coat a liquid on a plurality of faces of a substrate at one time, and to an inner volume control valve used in the coating nozzle.

BACKGROUND

Conventionally, a solar cell panel is inserted into a metallic outer frame with hot melt interposed as an adhesive or seal material. A solar cell panel has, for example, transparent electrodes provided at the rear side of a glass sheet of a light-receiving face side. Amorphous silicon and thin-film polycrystalline silicon are disposed between the transparent electrodes and the rear-face electrodes. A groove-shaped engagement portion for insertion of the solar cell panel is provided in the metallic outer frame. According to the conventional method, hot melt is coated at the engagement portion of the outer frame, and subsequently the solar cell panel is inserted in the engagement portion, thereby engaging the solar cell panel into the outer frame.

However, holes and the like for installation are provided at the engagement portion of the outer frame. In these circumstances, applying hot melt, which is fluid, at the engagement portion of the outer frame may not be desirable. Also, a large amount of hot melt may be applied at the engagement portion in order to reliably prevent water from entering between the solar cell panel and the outer frame. In this case, excess hot melt overflows from the engagement portion, and a step for removing the excess hot melt is required.

In order to solve these problems related to application of hot melt at the outer frame, a method has been proposed wherein hot melt is applied to the solar cell panel. By applying hot melt on the solar cell panel, it is possible to use fluid hot melt even when assembling the solar cell panel and an outer frame that includes holes for installation. Also, hot melt is applied directly on the solar cell panel, so it is possible to more reliably prevent water from entering the solar cell panel. Additionally a less expensive outer frame may be used with the solar cell panel.

One example of a conventional apparatus and method is provided at Japanese Patent Application No. 2000-243998.

In order to apply a liquid such as hot melt onto the outer peripheral part of a substrate such as a solar cell panel using a conventional coating device, three coating devices are typically necessary to apply respective liquids onto the end face of the substrate, the upper face of the substrate adjacent to the end face, and the lower face of the substrate adjacent to the end face. The three coating devices are respectively provided with a nozzle, a liquid supply valve for supplying liquid to the nozzle, and a liquid passage for supplying liquid to the liquid supply valve from a liquid supply source. Thus, one problem is additional expense incurred in providing a plurality of nozzles, a plurality of liquid supply valves, and a plurality of liquid supply passages. Also, the number of structural components increases, so a large space is required for installing the plurality of coating nozzles.

In addition, a plurality of liquid supply passages is necessarily provided from the liquid supply source to the plurality of coating nozzles, which causes the piping for the plurality of liquid supply passages to become complicated. Furthermore, the operation of positioning the respective plurality of coating nozzles with respect to the substrate takes time, and the operation of adjusting the timing of starting and stopping dispensing by the respective coating nozzles also takes time. In addition, the finish of the seam between respective films formed by the plurality of coating nozzles is not good. More specifically, the seam sticks upward, or bulges out.

Therefore, the object of the present invention is to provide a coating nozzle and coating method that can dispense liquid at the end face of a substrate and at the faces of the substrate adjacent to the end face. Also, the object of the present invention is to provide an inner volume control valve used with the coating nozzle.

SUMMARY OF THE INVENTION

In order to solve the problems described above, the present invention is a coating nozzle including a nozzle body having an inlet opening for receiving a liquid supplied from a liquid supply valve and an outlet opening for dispensing the liquid. The coating nozzle further includes a distribution plate, which is disposed adjacent to the nozzle body, and having an elongated bore for distributing the liquid dispensed from the outlet opening. The coating nozzle also includes a shim plate, which is disposed adjacent to the distribution plate, and provided with a cutout communicating with the elongated bore of the distribution plate. The coating nozzle further includes a baffle plate, which is disposed adjacent to the shim plate, and covering the cutout of the shim plate. A slot for dispensing the liquid on an end face of a substrate and on faces of the substrate adjacent to the end face is formed by the cutout of the shim plate between the distribution plate and the baffle plate.

Also, the present invention was devised as a coating method in order to solve the problems described above. More specifically, the coating method includes applying the liquid on the end face of the substrate and on faces of the substrate adjacent to the end face while the coating nozzle is moved along an edge of the substrate.

Also, the present invention includes an inner volume control valve in order to solve the problems described above. More specifically, the inner volume control valve includes a first entry opening for receiving a liquid supplied from a liquid supply valve, a plurality of exit openings for dispensing the liquid, and a cylinder provided between the plurality of exit openings and the first entry opening. The inner volume control valve also includes a first plunger, moving reciprocatingly inside the cylinder, and configured to stop at a plurality of positions inside the cylinder. The inner volume control valve also includes a first piston coupled to the first plunger, and one or more second plungers and second pistons acting on the first piston in order to halt the first plunger at the plurality of positions inside the cylinder. The position at which the first plunger stops is selected from among the plurality of positions in order to modify the number of exit openings from which the liquid is dispensed.

The present invention provides a coating nozzle and coating method that can dispense liquid at the end face of a substrate and at the faces of the substrate adjacent to the end face. Also, the present invention provides an inner volume control valve used with the coating nozzle. The coating nozzle of the present invention can dispense liquid at the end face of a substrate and at the faces of the substrate adjacent to the end face, so it is possible to reduce the expense of providing a plurality of nozzles, liquid supply valves, and liquid supply passages. Furthermore, the coating nozzle of the present invention can reduce the number of structural components compared to a coating device that uses a plurality of conventional coating nozzles, and can reduce the space for installing the coating nozzle. In addition, the coating nozzle of the present invention can reduce the number of liquid supply passages from the liquid supply source to the coating nozzle compared to a coating device that uses a plurality of conventional coating nozzles. In this regard, the coating nozzle of the present invention can reduce the time spent in attaching, positioning, and adjusting coating nozzles, and the time spent in adjusting the timing of starting and stopping dispensing. Moreover, the coating nozzle of the present invention can perform coating without forming seams between the coating film at the end face of the substrate and the coating films at the faces of the substrate adjacent to the end face.

DETAILED DESCRIPTION

Preferred embodiments of the present invention will be described below with reference to the accompanying drawings. However, the dimensions, materials, shape, relative dispositions, and so forth of the constituent components described in the following embodiments do not limit the scope of the present invention in any manner, unless specifically indicated otherwise.

Coating System

Figure 1:
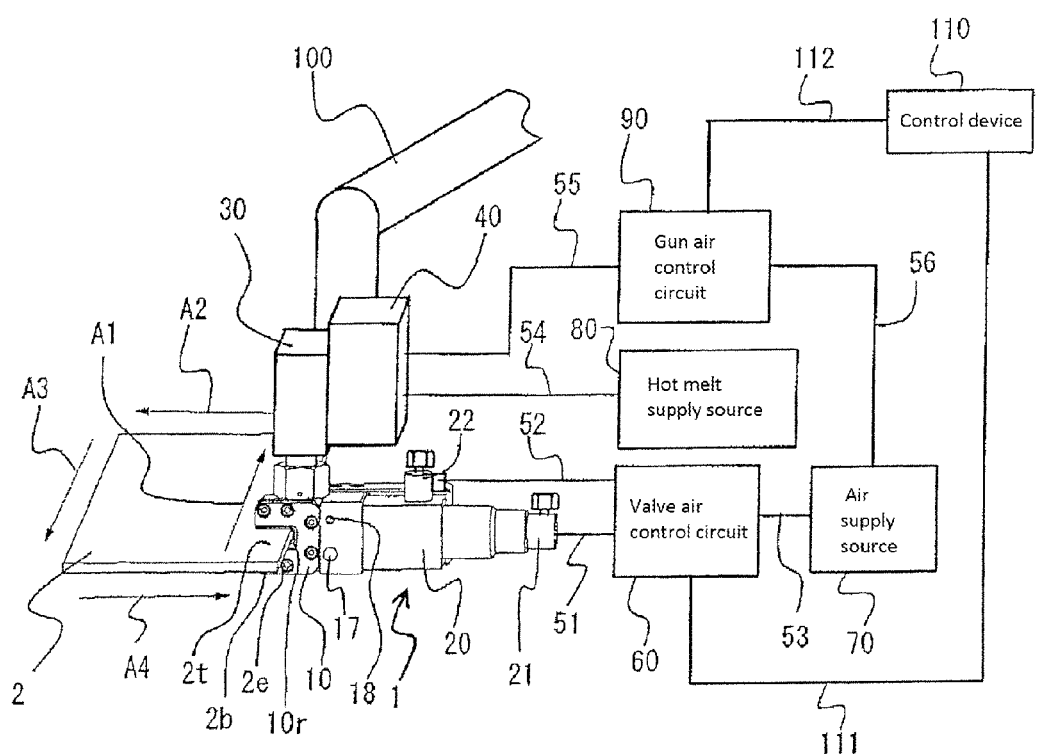
FIG. 1 is a drawing showing a coating system in accordance with the present invention.

FIG. 1 is a view showing a coating system in accordance with a first embodiment of the present invention. In this embodiment, a three-face coating device will be described as an example of a multi-face coating device. A three-face coating device 1 is attached to a robot arm 100. The robot arm 100 moves the three-face coating device 1 along the edge of the object being coated (i.e., a substrate), which is a solar cell panel 2 in FIG. 1. The solar cell panel 2 is a panel used in electricity generation from sunlight. The three-face coating device 1, while moving in the nozzle movement directions indicated by arrows A1, A2, A3, and A4, dispenses hot melt, which is a liquid such as an adhesive or sealant, on the end face of the edge of the solar cell panel 2, on the upper face (upper peripheral face) adjacent to the end face, and on the lower face (rear peripheral face) adjacent to the end face. This embodiment shows a configuration wherein the three-face coating device 1 is moved with respect to the solar cell panel 2, but the present invention is not limited to this operation. For example, the solar cell panel 2 may be moved with respect to the three-face coating device 1. Therefore, the nozzle movement direction indicates the relative movement direction of the three-face coating device 1 with respect to the solar cell panel 2.

The three-face coating device 1 includes a three-face coating nozzle 10, an inner volume control valve 20, a hot melt supply valve 30, and a gun 40. The three-face coating nozzle 10 has a cutout 10r configured to receive the solar cell panel 2. In the three-face coating nozzle 10, the cutout 10r for passage of the solar cell panel 2 is formed in the shape of the letter U. The inner volume control valve 20 is connected to a valve air control circuit 60 via passages 51 and 52. Speed controllers 21 and 22 are provided between the inner volume control valve 20 and the air passages 51 and 52. The valve air control circuit 60 is connected to an air supply source 70 via an air passage 53. The valve air control circuit 60 is controlled by a first air control signal 111 from a control device 110. The gun 40 is connected to a hot melt supply source 80 via a supply hot melt passage 54. The gun 40 is also connected to a gun air control circuit 90 via an air passage 55. The gun air control circuit 90 is connected to the air supply source 70 via an air passage 56. The gun air control circuit 90 is controlled by a second air control signal 112 from the control device 110.

Three-Face Coating Nozzle

Figure 2:
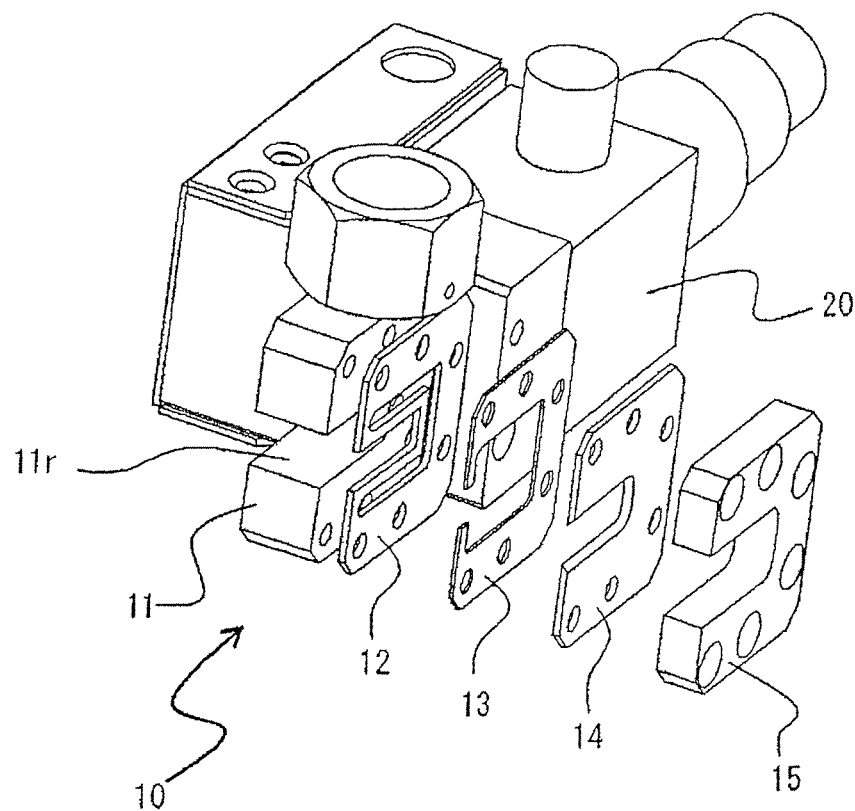
FIG. 2 is an exploded perspective view of a three-face coating nozzle of the coating system shown in FIG. 1.
Figure 3:
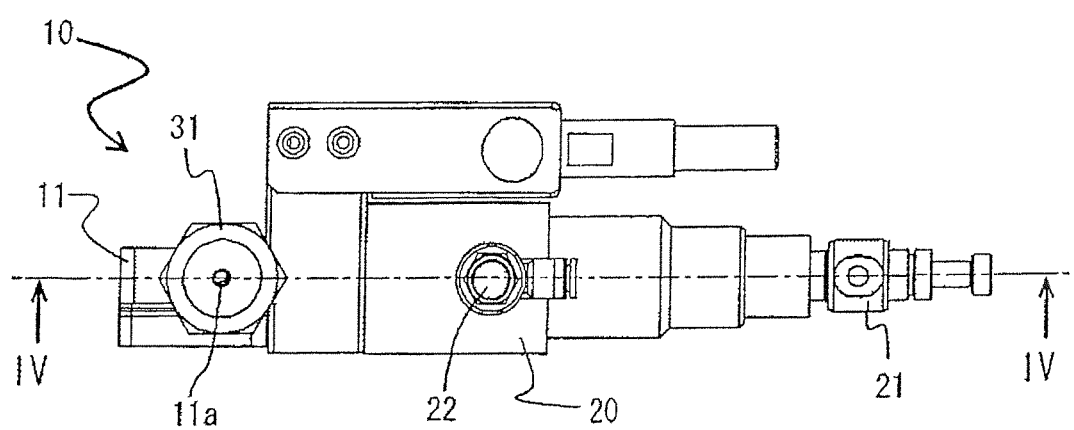
FIG. 3 is a plan view of the three-face coating nozzle and an inner volume control valve of the coating system shown in FIG. 1.

FIG. 2 is an exploded perspective view of the three-face coating nozzle 10. The three-face coating nozzle 10 is attached to one end of the inner volume control valve 20. The three-face coating nozzle 10 comprises a nozzle body 11, a distribution plate 12, a shim plate 13, a baffle plate 14, and an attachment plate 15. FIG. 3 is a plan view showing the three-face coating nozzle 10 and the inner volume control valve 20.

Figure 4:
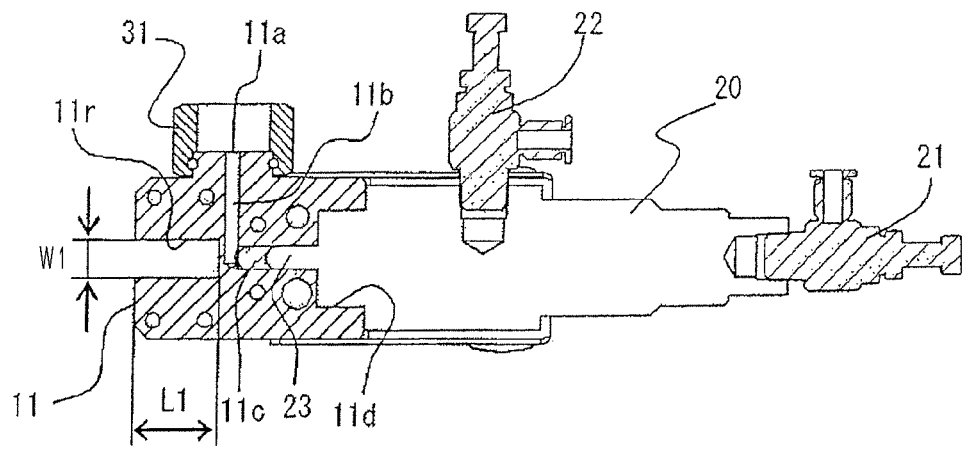
FIG. 4 is a cross-sectional view of the nozzle body of the nozzle taken along line IV-IV in FIG. 3.

FIG. 4 is a cross-sectional view of the nozzle body 11 taken along line IV-IV in FIG. 3. The nozzle body 11 includes a cutout 11r for passage of the solar cell panel 2. The cutout 11r has a width W1 and a length L1. The nozzle body 11 is attached to the hot melt supply valve 30 by a nut 31. The nozzle body 11 is directly attached to the hot melt supply valve 30, so the length of the hot melt passage in this embodiment is short. If the length of the hot melt passage were longer, a tapered coating film would be dispensed at the start of the dispensing operation, and moreover, the termination of the hot melt at the end of the dispensing operation would not be desirable. In this embodiment, the occurrence of tapered coating films at the start of the coating operation and defective hot melt termination at the end of the coating operation is reduced. An inlet opening 11a is provided in the nozzle body 11 to receive hot melt supplied from the hot melt supply valve 30. A first hot melt passage 11b communicating with the inlet opening 11a is provided in the nozzle body 11. Also, a cylinder 11c intersecting and communicating with the first hot melt passage 11b is provided in the nozzle body 11. The cylinder 11c is provided at the side opposite the cutout 11r with respect to the first hot melt passage 11b. A mounting bore 11d for mounting the inner volume control valve 20 is provided in the nozzle body 11. The cylinder 11c opens to the mounting bore 11d. A plunger 23 of the inner volume control valve 20 is inserted into the cylinder 11c. The plunger 23 moves in a reciprocating manner inside the cylinder 11c.

Figure 5:
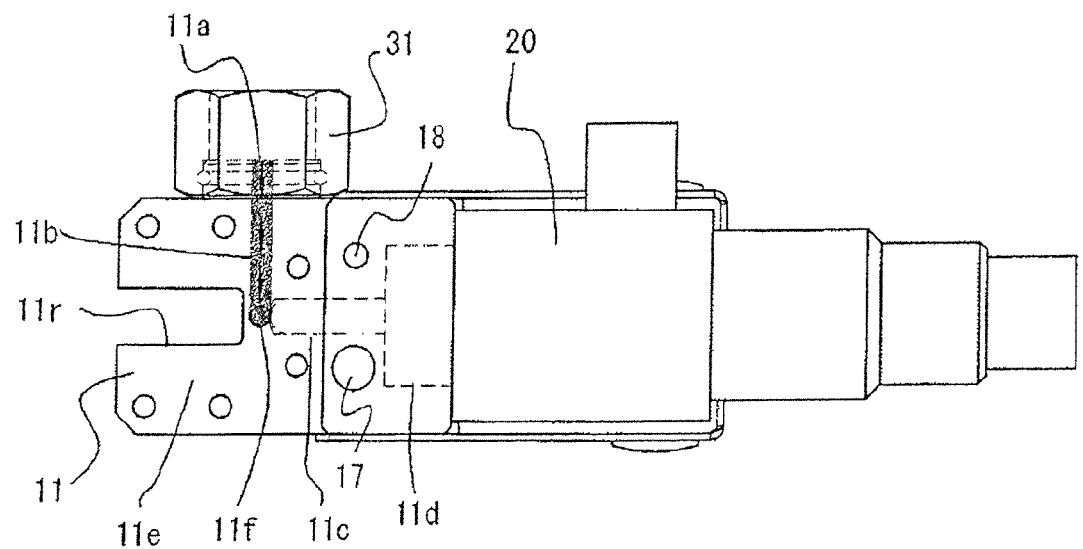
FIG. 5 is a front elevation view of the nozzle body of FIG. 4.

FIG. 5 is a front elevation view of the nozzle body 11. An outlet opening 11f for hot melt is provided in the attachment face 11e of the nozzle body 11, to which the distribution plate 12 is attached. A temperature adjustment heater 17 and a temperature sensor 18 are provided in the nozzle body 11. When the nozzle body 11 is cooled by ambient air and the solar cell panel 2, and the temperature of the nozzle body 11 drops, the termination of hot melt may not be desirable when the dispensing of hot melt ends. Therefore, the temperature adjustment heater 17 is provided in the nozzle body 11 in order to heat the nozzle body 11 and maintain an appropriate temperature. The temperature sensor 18 detects the temperature of the nozzle body 11. Based on the temperature detected by the temperature sensor 18, the control device 110 controls the temperature adjustment heater 17 and holds the nozzle body 11 at an appropriate temperature. As a result, termination of hot melt when the dispensing of hot melt ends is desirable.

Figure 6:
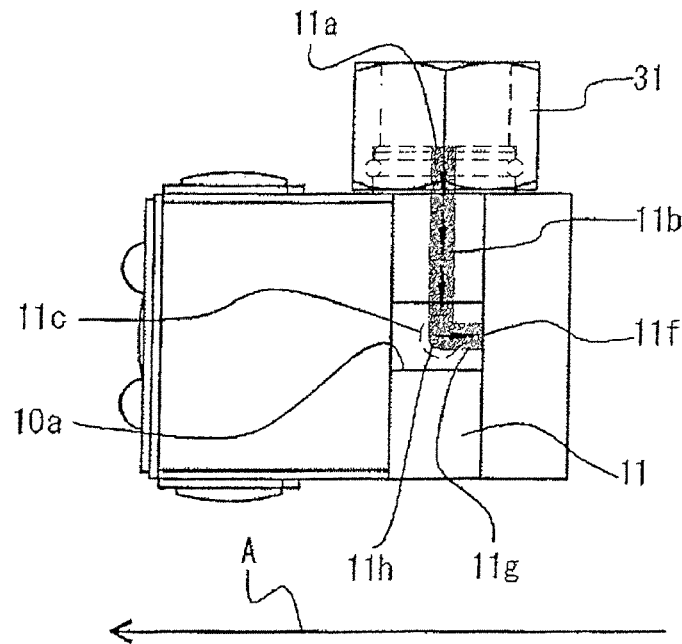
FIG. 6 is a side elevation view of the nozzle body of FIG. 4.

FIG. 6 is a side elevation view of the nozzle body 11. A second hot melt passage 11g in the nozzle body 11 communicates with the outlet opening 11f. In this embodiment, the second hot melt passage 11g extends parallel to direction A, the direction of relative movement of the three-face coating nozzle 10 with respect to the solar cell panel 2. Also, the first hot melt passage 11b extends perpendicularly with respect to the second hot melt passage 11g. The cylinder 11c communicates with the first hot melt passage 11b at a junction 11h of the first hot melt passage 11b and the second hot melt passage 11g.

Figure 7:
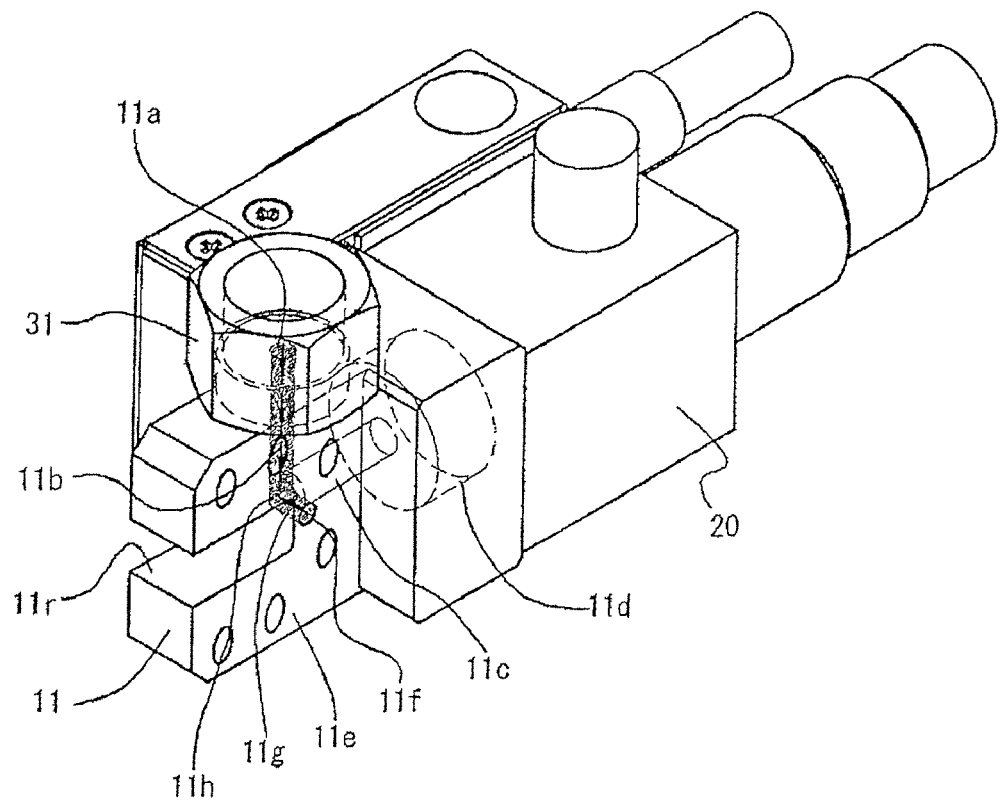
FIG. 7 is a perspective view of the nozzle body of FIG. 4.
Figure 8:
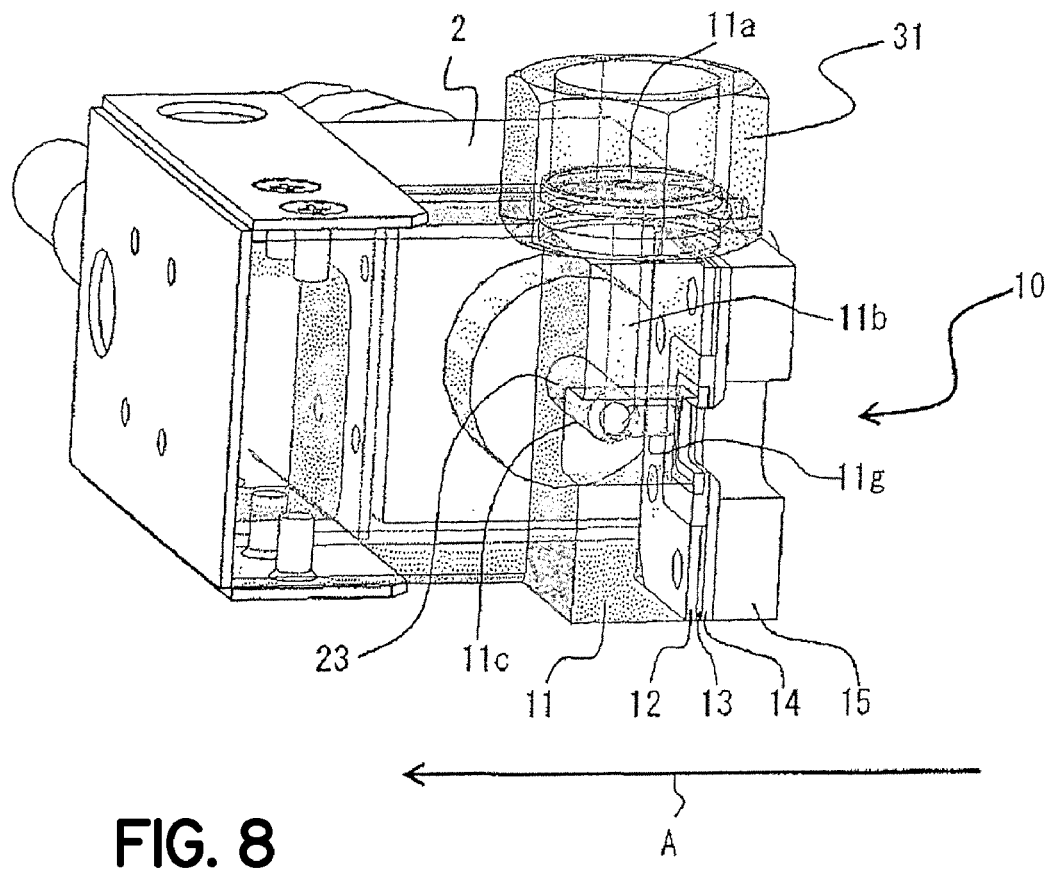
FIG. 8 is an explanatory view drawn with the nozzle body of FIG. 4 made transparent in order to show the hot melt passages of the nozzle body.

FIG. 7 is a perspective view of the nozzle body 11. FIG. 8 is an explanatory view drawn with the nozzle body 11 drawn transparent in order to show the hot melt passages of the nozzle body 11. When a hot melt supply valve 30 is attached to the nozzle body 11 by the nut 31, hot melt is supplied to the inlet opening 11a of the nozzle body 11. Hot melt flows from the inlet opening 11a, through the first hot melt passage 11b, and to the junction 11h. At this time, the tip of the plunger 23 inside the cylinder 11c is near the junction 11h. Hot melt flows from the junction 11h, through the second hot melt passage 11g, and to the outlet opening 11f.

Distribution Plate

Figure 9:
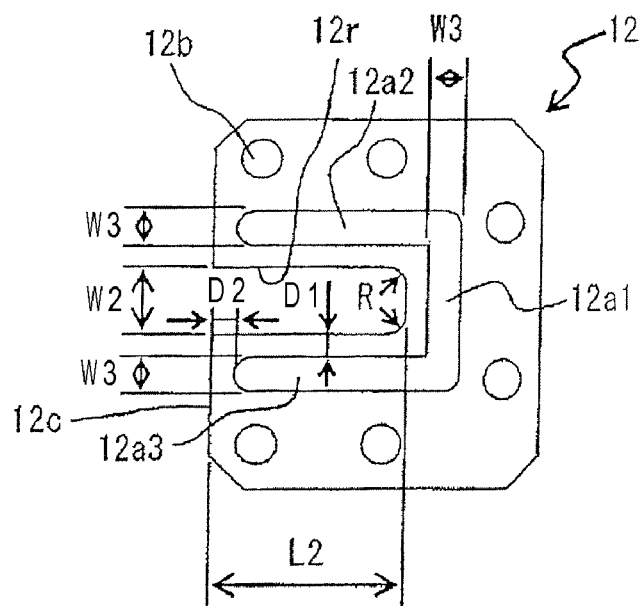
FIG. 9 is a front elevation view of the distribution plate of the coating system of FIG. 1.

FIG. 9 is a front elevation view of the distribution plate 12. The distribution plate 12 includes a cutout 12r for passage of the solar cell panel 2. The cutout 12r has a width W2 and a length L2. The top side of the cutout 12r and the intermediate side are joined by an arc with radius R, and the lower side of the cutout 12r and the intermediate side are joined by an arc with radius R. The width W2 of the cutout 12r of the distribution plate 12 is equal to or smaller than the width W1 of the cutout 11r of the nozzle body 11. Also, when the left end of the nozzle body 11 of FIG. 4 and the left end of the distribution plate 12 of FIG. 9 are disposed adjacent one another and attached, the length L2 of the cutout 12r of the distribution plate 12 is equal to or smaller than length L1 of the cutout 11r of the nozzle body 11. The dimensions of the width W2, the length L2, and the radius R of the distribution plate 12 can be selected to correspond to the desired coating shape and coating film thickness.

A U-shaped elongated bore 12a is provided in the distribution plate 12 along the periphery of the cutout 12r. The elongated bore 12a, as shown in FIG. 9, includes the vertical elongated bore 12a1; the upper lateral elongated bore 12a2, which extends horizontally from one end of the vertical elongated bore 12a1 along the upper side of the cutout 12r; and the lower lateral elongated bore 12a3, which extends horizontally from the other end of the vertical elongated bore 12a1 along the lower side of the cutout 12r. The elongated bore 12a has a width W3. The width W3 dimension affects the flow of hot melt and the uniformity of its distribution. A distance D1 defined between the cutout 12r and the elongated bore 12a determines the flow passage length of the slot that dispenses hot melt. Six holes 12b for receiving attachment screws are provided in the distribution plate 12.

Figure 10:
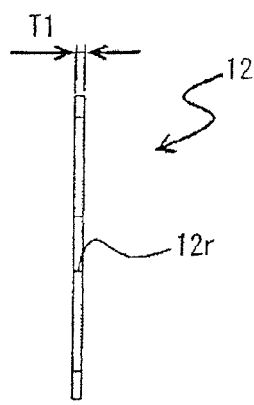
FIG. 10 is a side elevation view of the distribution plate of FIG. 9.

FIG. 10 is a side elevation view of the distribution plate 12. The distribution plate 12 has a thickness T1. The thickness T1 of the distribution plate 12 determines the volume of the hot melt reservoir inside the three-face coating nozzle 10. Below, the flow of hot melt in the distribution plate 12 will be described.

Figure 11:
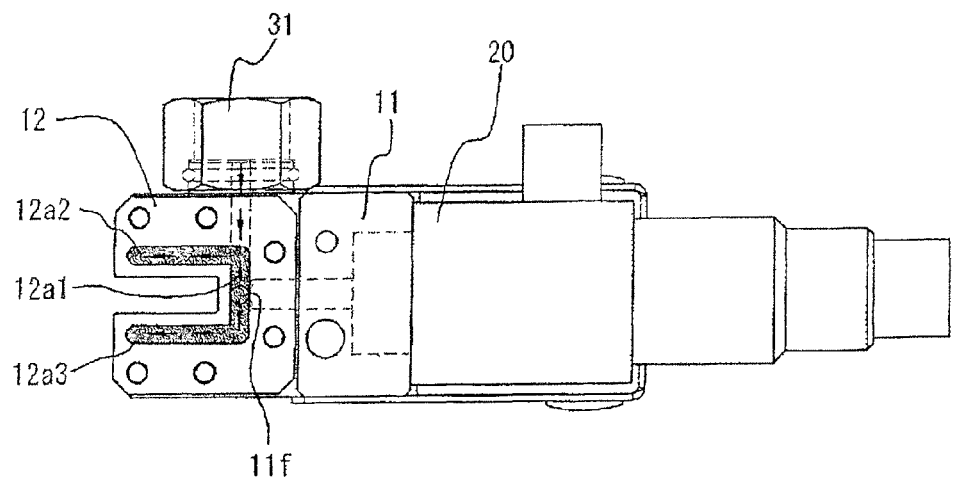
FIG. 11 is a front elevation view of the distribution plate attached to the nozzle body of FIG. 4.
Figure 12:
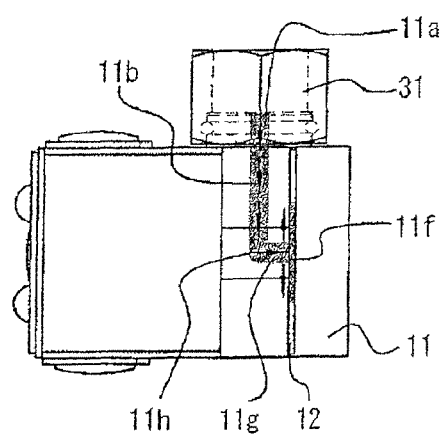
FIG. 12 is a side elevation view of the distribution plate attached to the nozzle body of FIG. 4.
Figure 13:
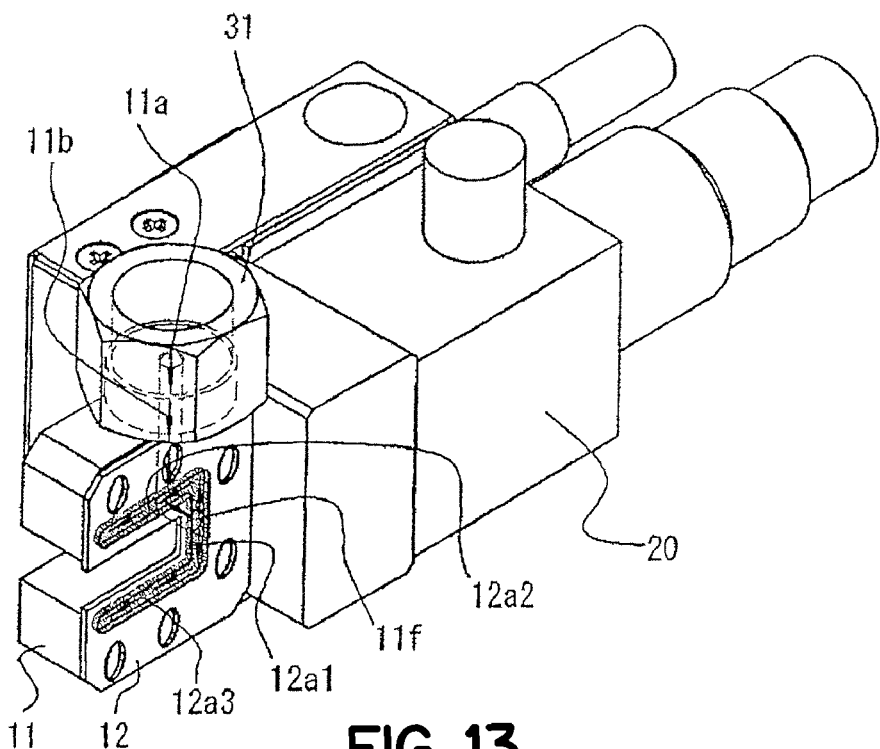
FIG. 13 is a perspective view of the distribution plate attached to the nozzle body of FIG. 4.

FIG. 11, FIG. 12, and FIG. 13 are, respectively, a front elevation view, a side elevation view, and a perspective view of the distribution plate 12 attached to the nozzle body 11. Hot melt supplied from the hot melt supply valve 30 flows from the inlet opening 11a of the nozzle body 11, passes through the first hot melt passage 11b, junction 11h, and second hot melt passage 11g, then flows to the outlet opening 11f, and is dispensed from the outlet opening 11f. Hot melt dispensed from the outlet opening 11f flows and is distributed to the top and bottom of the vertical elongated bore 12a1 of the distribution plate 12. Hot melt that flows to the top flows inside the upper lateral elongated bore 12a2 and fills the interior of the upper lateral elongated bore 12a2. Hot melt that flows to the bottom flows inside the lower lateral elongated bore 12a3 and fills the interior of the lower lateral elongated bore 12a3.

Hot melt is distributed by the distribution plate 12 to the dispensing port corresponding to the end face of the solar cell panel 2, the dispensing port corresponding to the upper face, and the dispensing port corresponding to the lower face. The vertical elongated bore 12a1, upper lateral elongated bore 12a2, and lower lateral elongated bore 12a3 of the distribution plate 12 form a hot melt reservoir.

Shim Plate

Figure 14:
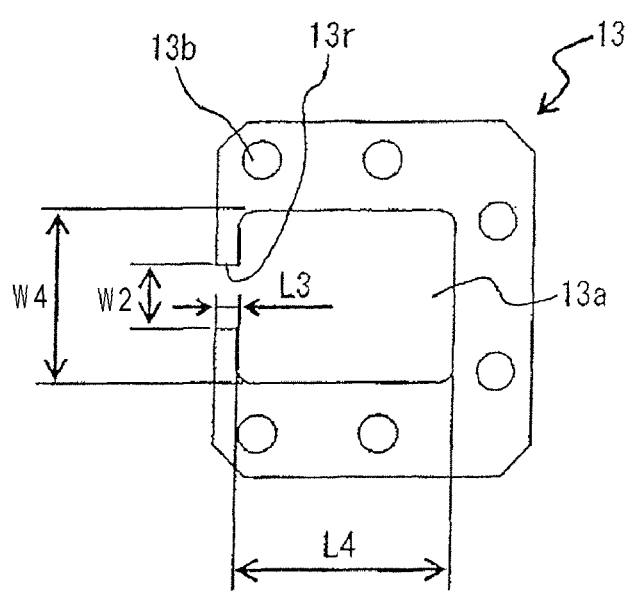
FIG. 14 is a front elevation view of the shim plate of the coating system of FIG. 1.

FIG. 14 is a front elevation view of the shim plate 13. The shim plate 13 includes a first cutout 13r for passage of the solar cell panel 2. The first cutout 13r has a width W2 and a length L3. The width W2 of the first cutout 13r is equal to the width W2 of the cutout 12r of the distribution plate 12. The length L3 of the first cutout 13r is equal to the distance D2 from the left end 12c of the distribution plate 12 shown in FIG. 9 to the ends of the upper lateral elongated bore 12a2 and lower lateral elongated bore 12a3. However, the width W2 and the length L3 are not limited to this in other embodiments.

A second cutout 13a is provided in the shim plate 13. The second cutout 13a communicates with the first cutout 13r. The second cutout 13a has a width W4 and a length L4. The width W4 of the second cutout 13a is equal to the length of the vertical elongated bore 12a1 of the distribution plate 12. The length L4 of the second cutout 13a is equal to the length of the upper lateral elongated bore 12a2 or lower lateral elongated bore 12a3. However, the width W4 and the length L4 are not limited to this in other embodiments.

When the shim plate 13 is disposed adjacent to the distribution plate 12, the second cutout 13a of the shim plate 13 communicates with the vertical elongated bore 12a1, the upper lateral elongated bore 12a2, and the lower lateral elongated bore 12a3 of the distribution plate 12. In this embodiment, the second cutout 13a of the shim plate 13 has dimensions which exactly surround the vertical elongated bore 12a1, the upper lateral elongated bore 12a2, and the lower lateral elongated bore 12a3 of the distribution plate 12. However, the dimensions of the second cutout 13a may not be limited to this. The second cutout 13a of the shim plate 13 defines a plurality of slots for dispensing hot melt to the solar cell panel 2. In this embodiment, the plurality of slots is continuously formed. The width W2 and the length L3 of the first cutout 13r and the width W4 and the length L4 of the second cutout 13a can be selected to correspond to the desired coating shape and coating film thickness.

Figure 15:
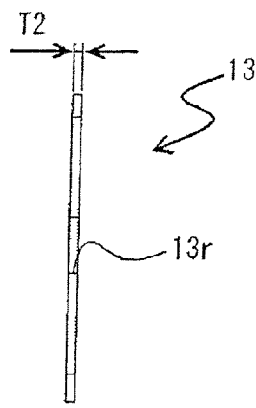
FIG. 15 is a side elevation view of the shim plate of FIG. 14.

Six holes 13b for receiving attachment screws are provided in the shim plate 13. FIG. 15 is a side elevation view of the shim plate 13. The shim plate 13 has a thickness T2. The thickness T2 of the shim plate 13 determines the width of the slot that dispenses hot melt.

Figure 16:
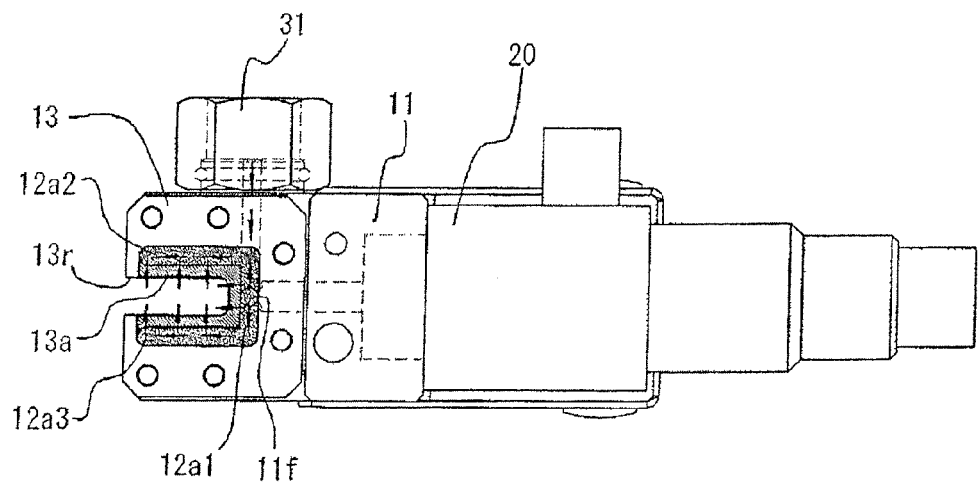
FIG. 16 is a front elevation view of the shim plate attached adjacent to the distribution plate of FIG. 9.
Figure 17:
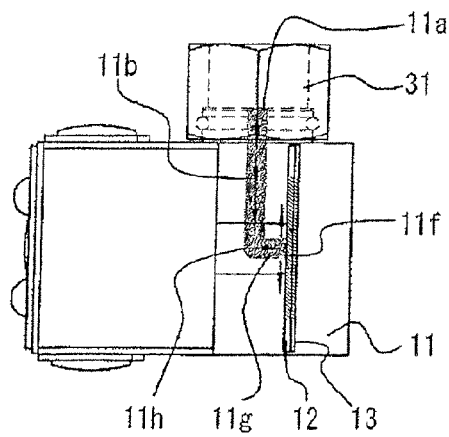
FIG. 17 is a side elevation view of the shim plate attached adjacent to the distribution plate of FIG. 9.
Figure 18:
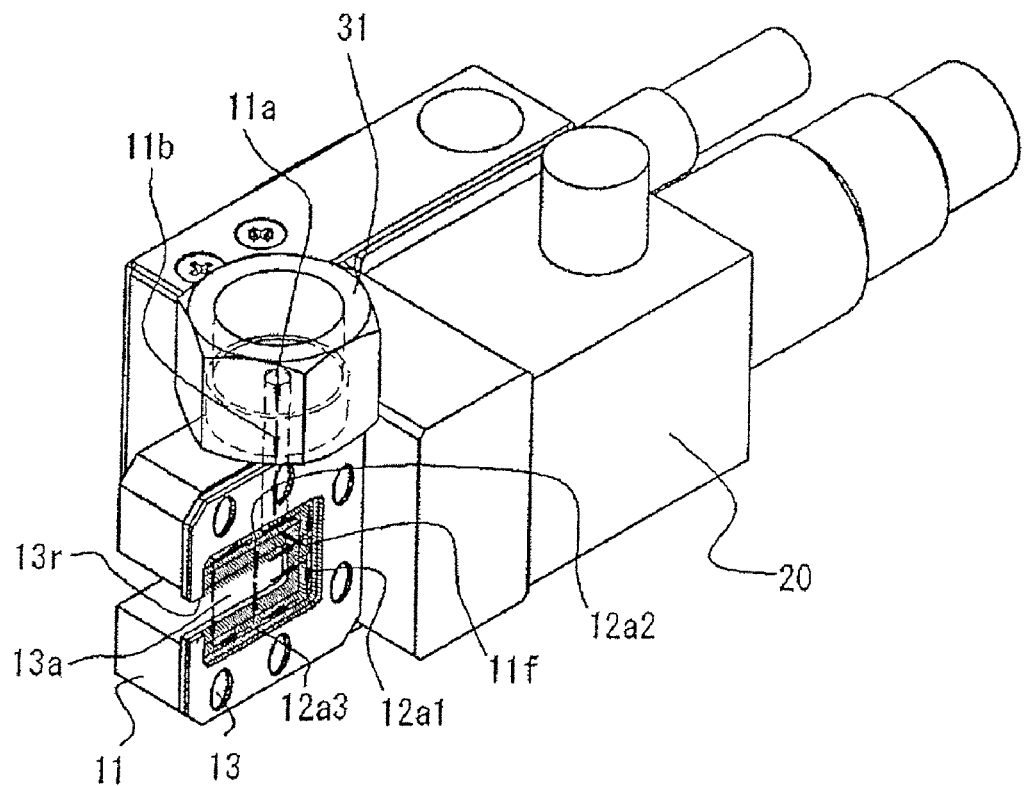
FIG. 18 is a perspective view of the shim plate attached adjacent to the distribution plate of FIG. 9.

FIG. 16, FIG. 17, and FIG. 18 are, respectively, a front elevation view, a side elevation view, and a perspective view of the shim plate 13 attached adjacent to the distribution plate 12. Hot melt flows from the vertical elongated bore 12a1, the upper lateral elongated bore 12a2, and the lower lateral elongated bore 12a3 of the distribution plate 12 to slots 13a1, 13a2, and 13a3 respectively.

Baffle Plate

Figure 19:
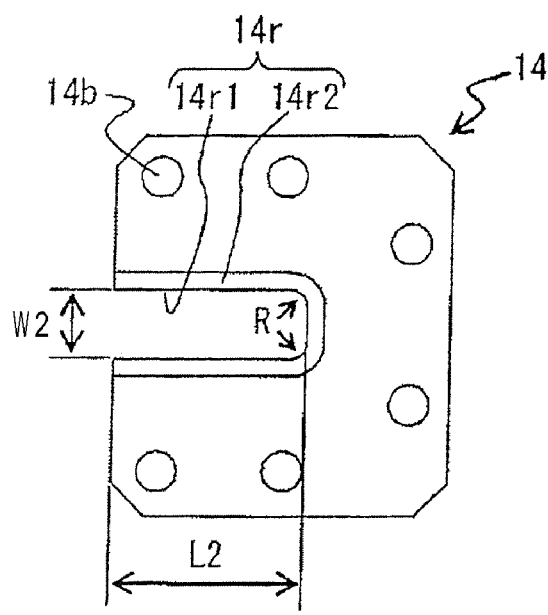
FIG. 19 is a front elevation view of a baffle plate of the coating system of FIG. 1.
Figure 20:
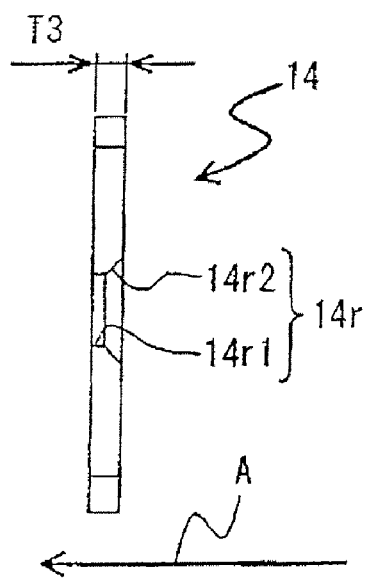
FIG. 20 is a side elevation view of the baffle plate of FIG. 19.

FIG. 19 is a front elevation view of the baffle plate 14. FIG. 20 is a side elevation view of the baffle plate 14. The baffle plate 14 includes a cutout 14r for receiving the solar cell panel 2. The cutout 14r has a width W2 and a length L2. The top side of the cutout 14r and the intermediate side are joined by an arc with radius R, and the lower side of the cutout 14r and the intermediate side are joined by an arc with radius R. In this embodiment, the width W2 of the cutout 14r of the baffle plate 14 is equal to the width W2 of the cutout 12r of the distribution plate 12. Also, the length L2 of the cutout 14r of the baffle plate 14 is equal to the length L2 of the cutout 12r of the distribution plate 12. However, the width W2 and the length L2 of the cutout 14r are not limited to this. The dimensions of the width W2, the length L2, and radius R of the baffle plate 14 can be selected to correspond to the desired coating shape and coating film thickness. Six holes 14b for receiving attachment screws are provided in the baffle plate 14.

FIG. 20 is a side elevation view of the baffle plate 14. The baffle plate 14 has a thickness T3. The thickness T3 of the baffle plate 14 determines the length of the lip of the nozzle. The cutout 14r includes parallel part 14r1 and inclined part 14r2. The parallel part 14r1 is parallel to nozzle movement direction A. The inclined part 14r2 is inclined with respect to nozzle movement direction A, and widens toward the downstream side of nozzle movement direction A. The shape of the cutout 14r affects coating uniformity, the appearance of the coating film, and termination quality. The shape of the cutout 14r is selected to correspond to the coating speed and type of adhesive so as to produce the best coating.

Figure 21:
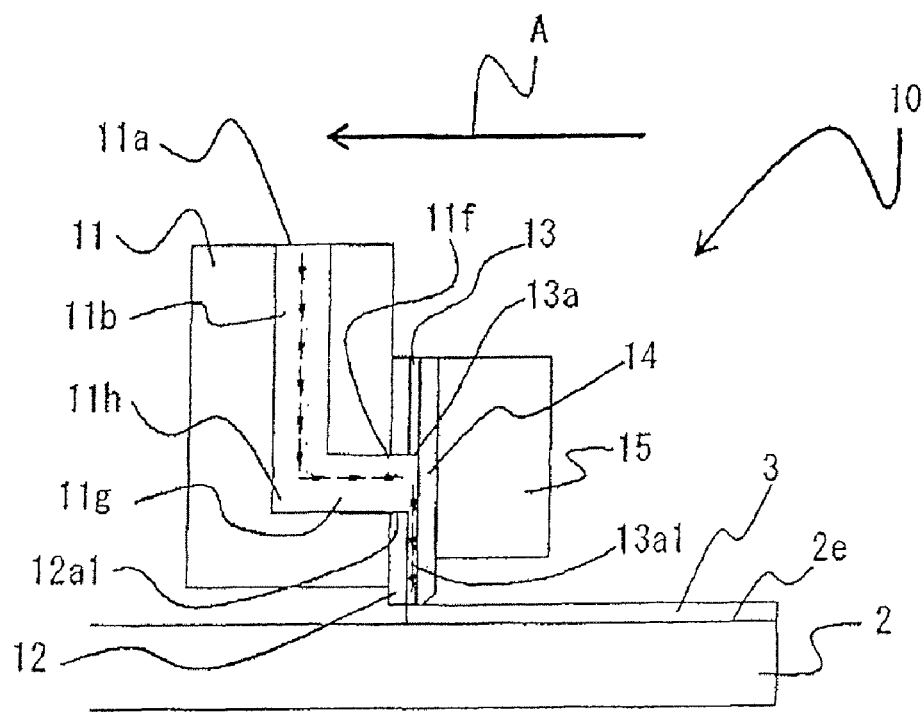
FIG. 21 is an explanatory view of the nozzle tip of the three-face coating nozzle of FIG. 2.

Next, the effect of the shape of the cutout 14r on coating termination quality will be explained. FIG. 21 is an explanatory view of the nozzle tip of the three-face coating nozzle 10. The three-faced coating nozzle 10 is moved by the robot arm 100, with respect to the solar cell panel 2, in the nozzle movement direction A. Hot melt dispensed from the outlet opening 11f of the nozzle body 11 passes through the vertical elongated bore 12a1 of the distribution plate 12, and flows to the slot 13a1. The slot 13a1 is formed by the second cutout 13a of the shim plate 13 between the distribution plate 12 and the baffle plate 14. Hot melt dispensed from the slot 13a1 forms a coating film 3 on an end face 2e of the solar cell panel 2.

Figure 22:
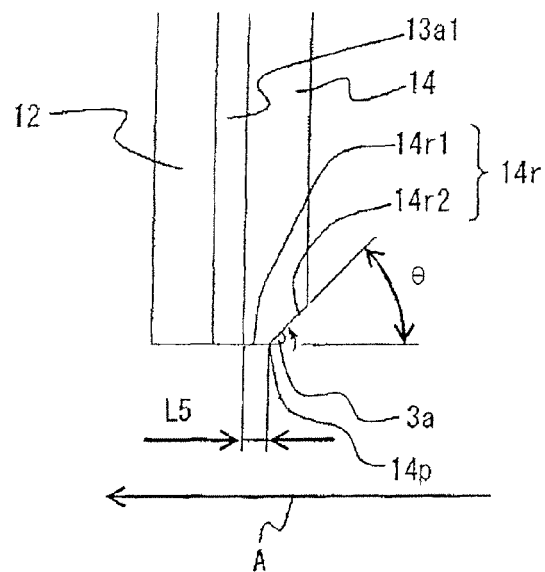
FIG. 22 is an enlarged view of the nozzle tip of FIG. 21.

FIG. 22 is an enlarged view of the nozzle tip. The parallel part 14r1 of the baffle plate 14 defines a plane, having length L5, parallel to nozzle movement direction A. The inclined part 14r2 is continuous with the parallel part 14r1 and is located at the downstream side of nozzle movement direction A from the parallel part 14r1. The inclined part 14r2 of the baffle plate 14 is chamfered so as to define an inclined face having an inclination of angle θ with respect to the parallel part 14r1. The inclined part 14r2 is inclined in the direction away from the solar cell panel 2. Hot melt dispensed from the slot 13a1 is smoothed by the parallel part 14r1, and made uniform. At contact line 14p between the parallel part 14r1 and the inclined part 14r2, the cutout 14r of the baffle plate 14 creates a separation of the dispensed hot melt, at least in theory. Nevertheless, dispensed hot melt may wrap around the inclined face 14r2. This wrapped hot melt 3a is the cause of stringing.

The shape of the cutout 14r of the baffle plate 14 affects the cut-off of the dispensed hot melt. The shorter that the length L5 of the horizontal part 14r1 of the cutout 14r becomes, the less the contact between the horizontal part 14r1 and the hot melt. Therefore, the amount of hot melt that wraps around and adheres to the inclined face 14r2 is minimized, and the termination is desirable. However, a suitable length for the length L5 is selected according to the viscosity of the hot melt, coating speed, and coating amount. The inclined part 14r2 also minimizes the amount of remaining hot melt which wraps around, thereby minimizing stringing. An appropriate value is selected for the angle θ of the inclined part 14r2, according to the viscosity of the hot melt, coating speed, and coating amount.

Figure 23:
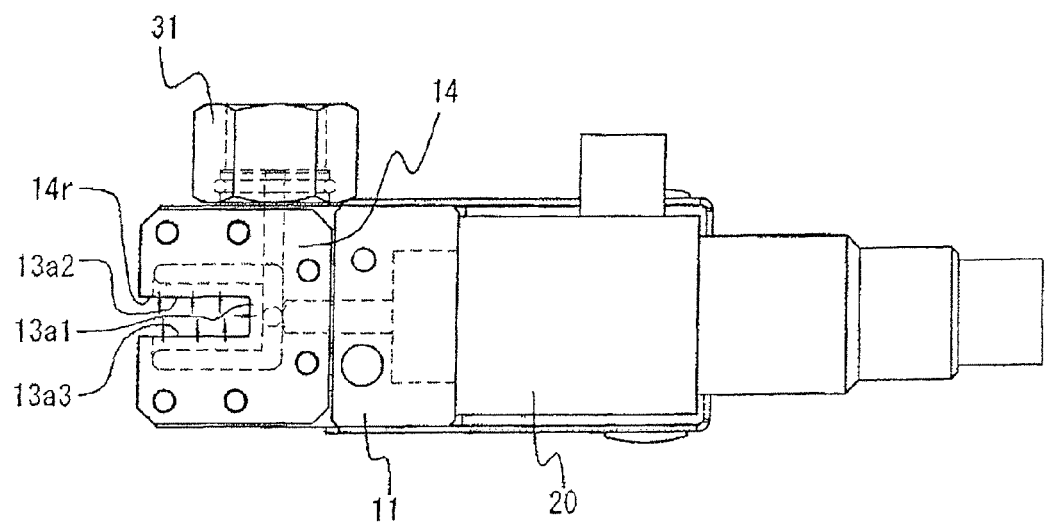
FIG. 23 is a front elevation view of the baffle plate of FIG. 19 attached adjacent to the shim plate of FIG. 14.
Figure 24:
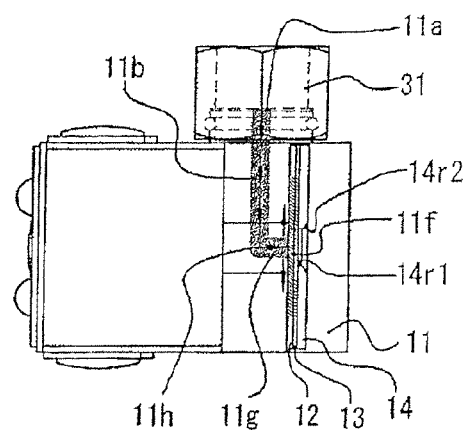
FIG. 24 is a side elevation view of the baffle plate attached adjacent to the shim plate of FIG. 14.
Figure 25:
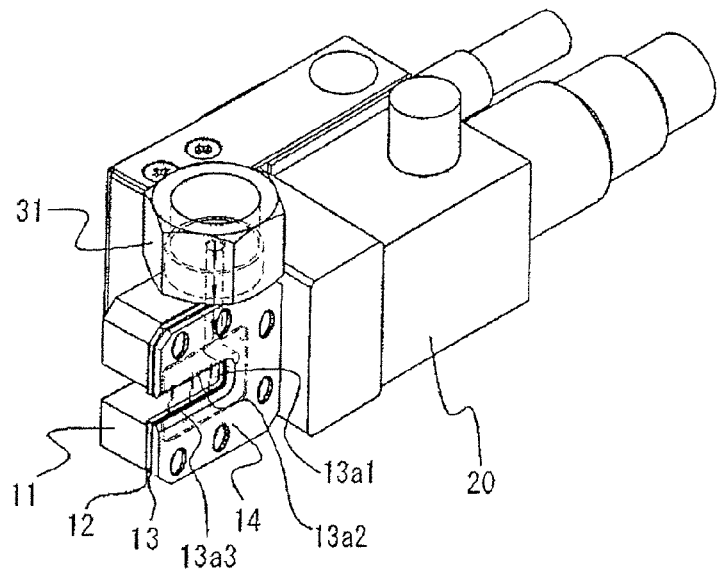
FIG. 25 is a perspective view of the baffle plate attached adjacent to the shim plate of FIG. 14.

FIG. 23, FIG. 24, and FIG. 25 are, respectively, a front elevation view, a side elevation view, and a perspective view of the baffle plate 14 attached adjacent to the shim plate 13. The baffle plate 14 is attached so as to cover the second cutout 13a of the shim plate 13. The second cutout 13a of the shim plate 13, located between the distribution plate 12 and the baffle plate 14, forms the first slot 13a1 for dispensing hot melt on the end face 2e of the solar cell panel 2, the second slot 13a2 for dispensing hot melt on the upper face, and third slot 13a3 for dispensing hot melt on the lower face. The first slot 13a1 and the second slot 13a2 are continuous. Also, the first slot 13a1 and the third slot 13a3 are continuous. Therefore, the upper face 2t, end face 2e, and lower face 2b of the end of the solar cell panel 2 can be continuously coated.

Figure 26:
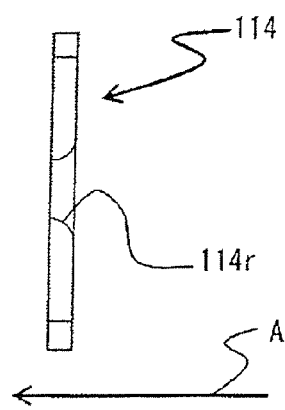
FIG. 26 is a side elevation view of a first alternative embodiment of the baffle plate of the coating system of FIG. 1.
Figure 27:
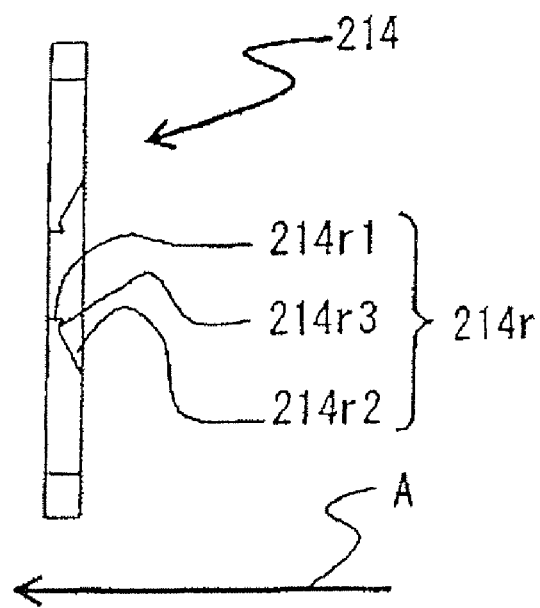
FIG. 27 is a side elevation view of a second alternative embodiment of the baffle plate of the coating system of FIG. 1.

Next, alternative embodiments of the baffle plate 14 will be illustrated. FIG. 26 is a side elevation view of a first alternative embodiment of a baffle plate 114. A cutout part 114r of the baffle plate 114 is formed as a face having an arc-shaped cross-section. The shape opens to the upstream side in the nozzle movement direction A. FIG. 27 is a side elevation view of a second alternative embodiment of for a baffle plate 214. A cutout part 214r of the baffle plate 214 comprises a parallel part 214r1 parallel to nozzle movement direction A, an inclined part 214r2 having an angle with respect to nozzle movement direction A, and a recess-shaped depression 214r3 connecting the parallel part 214r1 and the inclined part 214r2. The inclined part 214r2 widens toward the downstream side of nozzle movement direction A. The shape of the cutout of the baffle plate affects the cut-off of dispensed hot melt, so an appropriate shape is selected according to the viscosity of the hot melt, coating speed, and coating amount. Furthermore, in these embodiments a baffle plate is used, but the present invention does not necessarily have to use a baffle plate. For example, it is possible to omit the baffle plate and attach the attachment plate described below adjacent to the shim plate.

Attachment Plate

Figure 28:
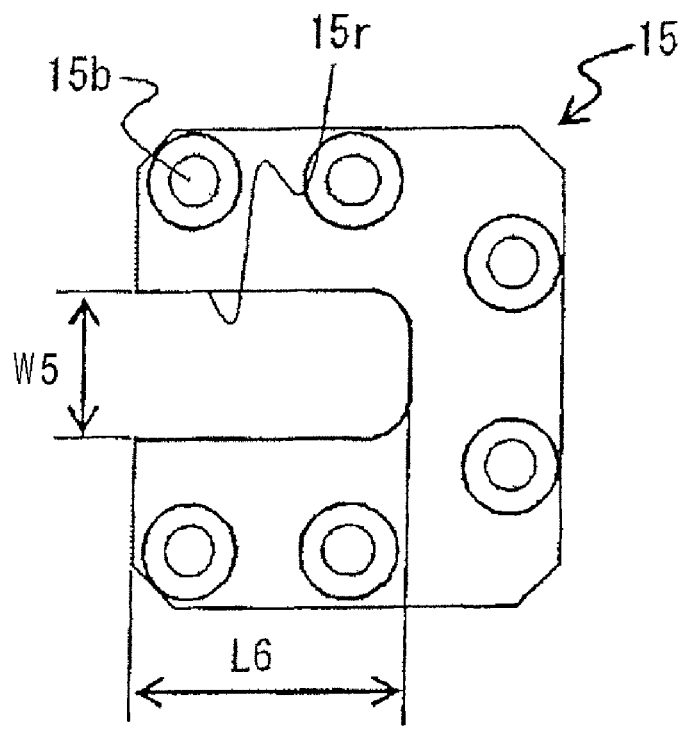
FIG. 28 is a front elevation view of an attachment plate of the coating system of FIG. 1.

FIG. 28 is a front elevation view of the attachment plate 15. The attachment plate 15 includes a cutout 15r for receiving the solar cell panel 2. The cutout 15r has a width W5 and a length L6. The width W5 is equal to or longer than twice the width of the inclined part 14r2 added to the width W2 of the cutout 14r of the baffle plate 14. The length L6 is equal to or longer than the width of the inclined part 14r2 added to the length L2 of the cutout 14r of the baffle plate 14. Six countersunk holes 15b for accommodating the heads of screws 4 are provided in the attachment plate 15.

Figure 29:
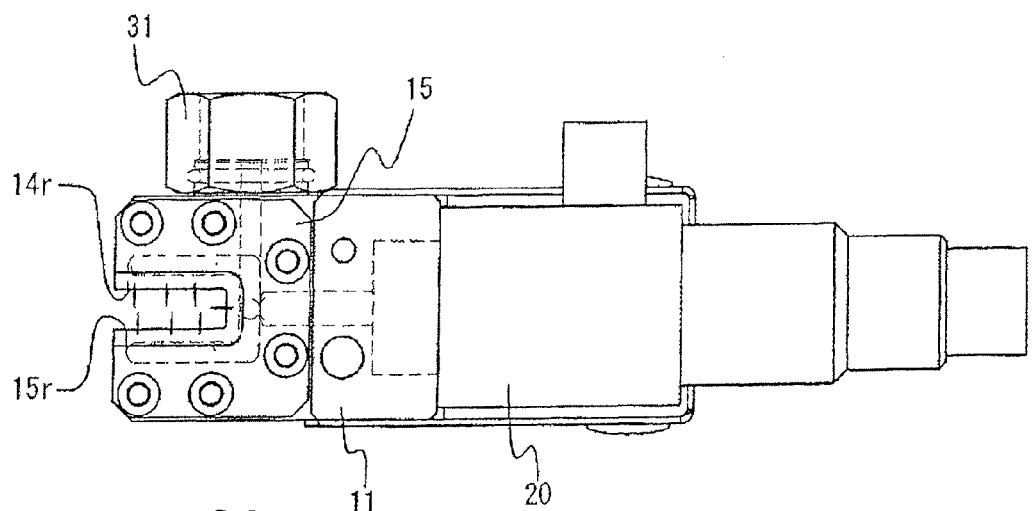
FIG. 29 is a front elevation view of the attachment plate of FIG. 28 attached adjacent to the baffle plate of FIG. 19.
Figure 30:
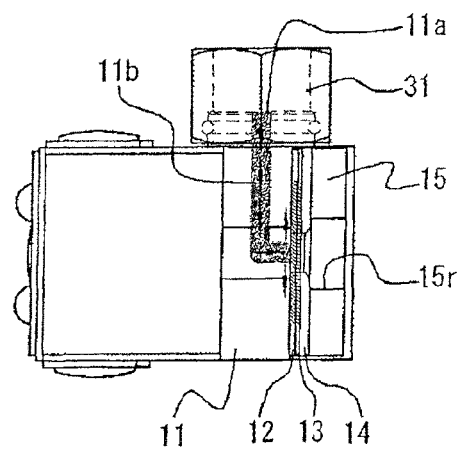
FIG. 30 is a side elevation view of the attachment plate attached adjacent to the baffle plate of FIG. 19.
Figure 31:
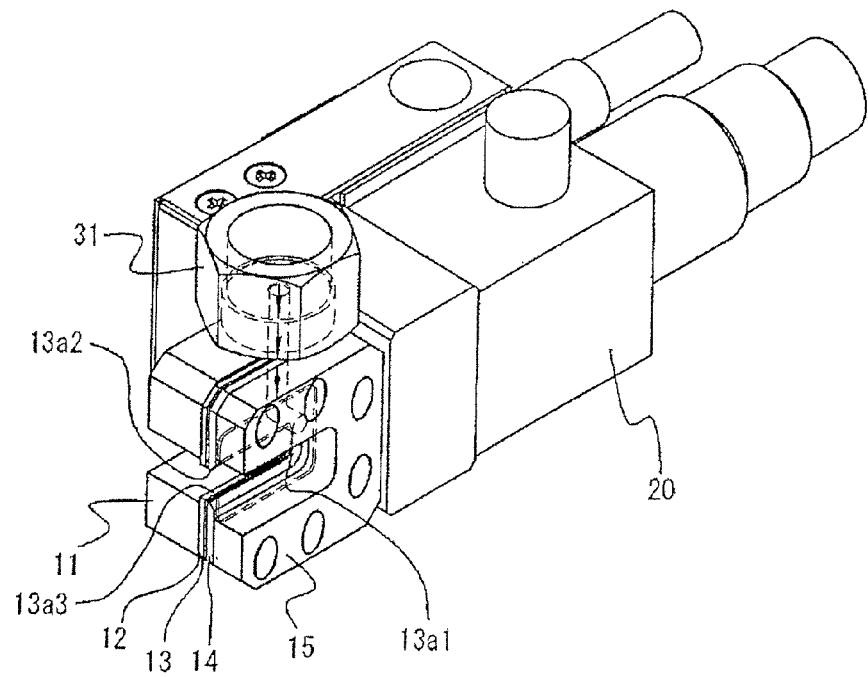
FIG. 31 is a perspective view of the attachment plate attached adjacent to the baffle plate of FIG. 19.

FIG. 29, FIG. 30, and FIG. 31 are, respectively, a front elevation view, a side elevation view, and a perspective view of the attachment plate 15 attached adjacent to the baffle plate 14. The distribution plate 12, the shim plate 13, and the baffle plate 14, which collectively form the first, second, and third slots 13a1, 13a2, and 13a3, each extend into the cutout more than the nozzle body 11 or attachment plate 15.

Hot Melt Flow Passage

Figure 32:
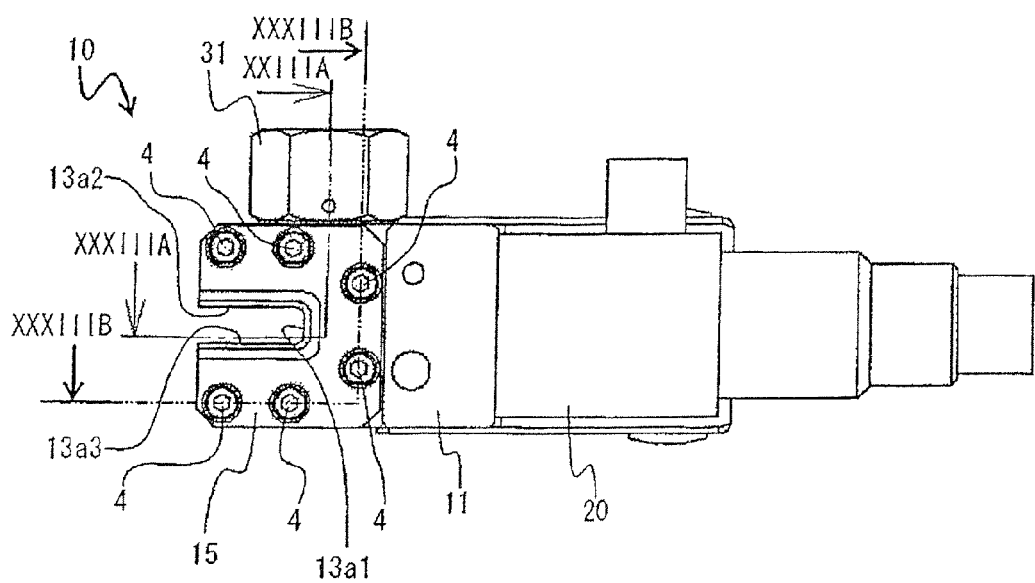
FIG. 32 is a view showing the three-face coating nozzle of FIG. 2 fixed by screws to the attachment plate of FIG. 28.
Figure 33:
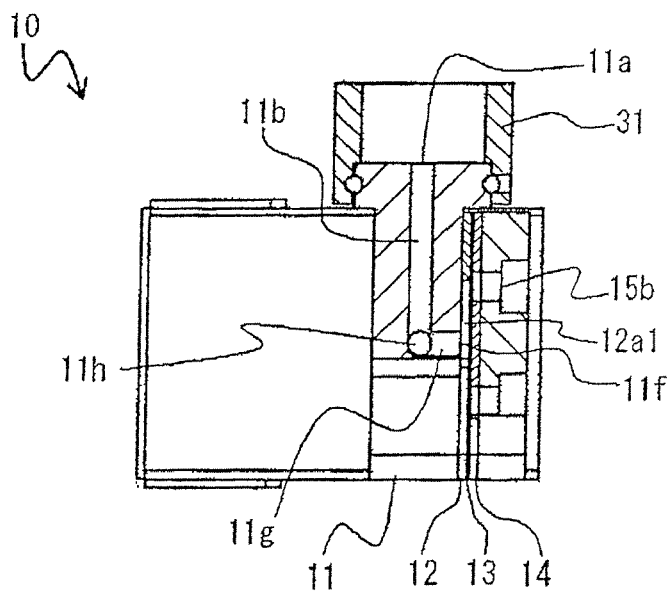
FIG. 33 is a cross-section side elevation view of the three-face coating nozzle taken partially along line XXXIIIA-XXXIIIA in FIG. 32 and taken partially along line XXXIIIB-XXXIIIB in FIG. 32.
Figure 34:
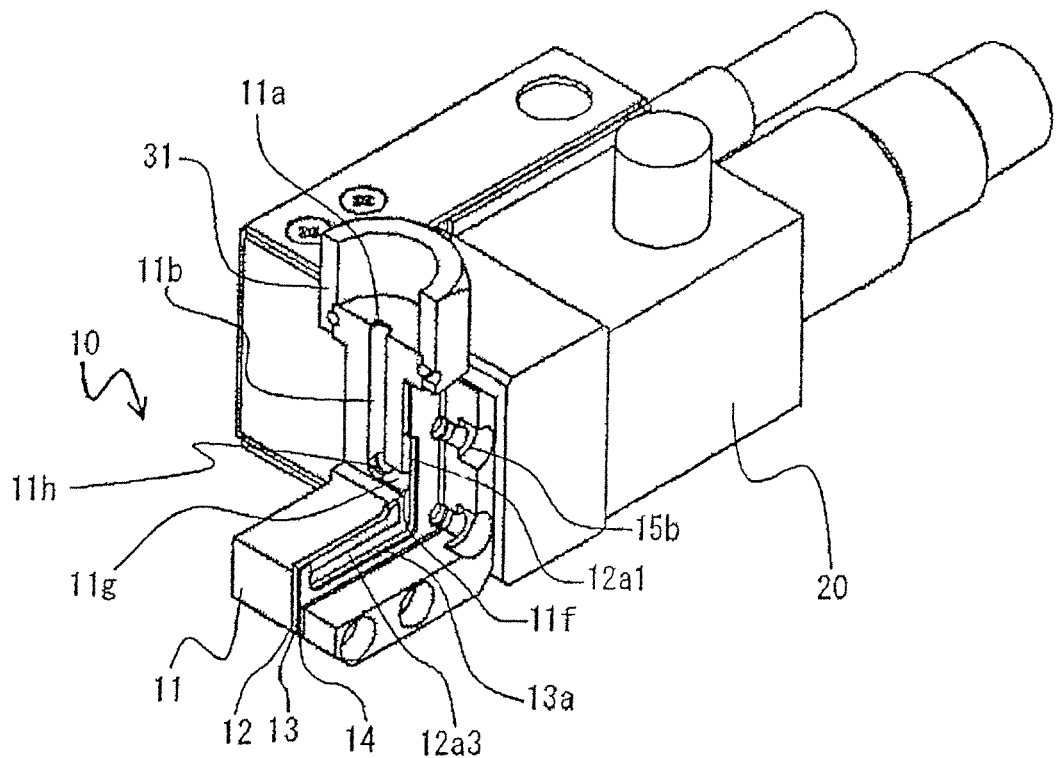
FIG. 34 is a partially cut-away perspective view of the three-face coating nozzle taken partially along line XXXIIIA-XXXIIIA in FIG. 32 and taken partially along line XXXIIIB-XXXIIIB in FIG. 32.

FIG. 32 is a view showing the three-face coating nozzle 10 fixed by screws 4. The distribution plate 12, the shim plate 13, the baffle plate 14, and the attachment plate 15 are attached to the nozzle body 10 by six screws 4. FIG. 33 and FIG. 34 are, respectively, a cross-section side elevation view and a cross-section perspective view of the three-face coating nozzle 10 taken partially along line XXXIIIA-XXXIIIA and taken partially along line XXXIIIB-XXXIIIB in FIG. 32. The screws 4 are omitted in this figure.

Hot melt is supplied from the hot melt supply valve 30, attached to the nozzle body 11 by the nut 31, to the inlet opening 11a of the nozzle body 11. Hot melt passes through the first hot melt passage 11b and reaches the junction 11h of the first and second hot melt passages 11b and 11g. Hot melt passes from the junction 11h to the second hot melt passage 11g, and is dispensed from the outlet opening 11f to the vertical elongated bore 12a1 of the distribution plate 12. Hot melt flows from the vertical elongated bore 12a1 to the upper lateral elongated bore 12a2 and the lower lateral elongated bore 12a3. Hot melt passes from the vertical elongated bore 12a1, the upper lateral elongated bore 12a2, and the lower lateral elongated bore 12a3 through the second cutout 13a of the shim plate 13, and is dispensed from the first, second, and third slots 13a1, 13a2, and 13a3 formed between the distribution plate 12 and the baffle plate 14.

Operation Between Dispensing Cycles

Figure 35:
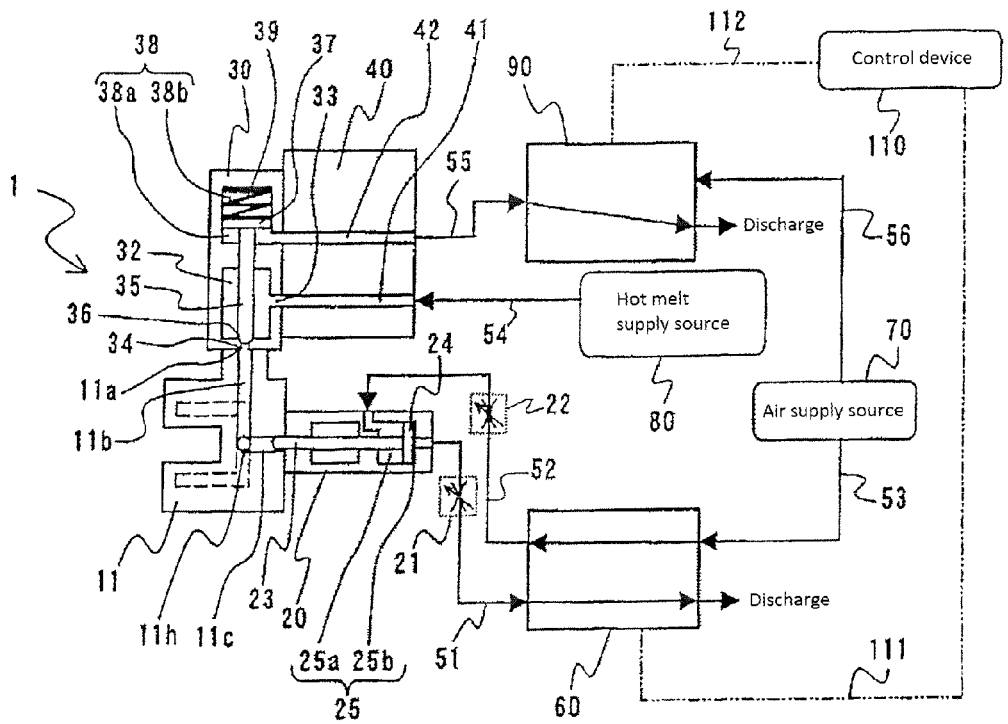
FIG. 35 is a view showing the inner volume control valve and hot melt supply valve of the coating system of FIG. 1 between dispensing cycles.

Below, the operation of the three-face coating device 1 will be described. FIG. 35 is a view showing the inner volume control valve 20 and the hot melt supply valve 30 before and after dispensing hot melt. The inner volume control valve 20 is fixed to the nozzle body 11 by a tightening member such as a screw (not shown in the drawings). The plunger 23 is provided in the inner volume control valve 20 so that it can move in a reciprocating manner. One end of the plunger 23 is inserted into the cylinder 11c of the nozzle body 11. The other end of the plunger 23 is fixed to a piston 24. The piston 24 is provided so that it can move in a reciprocating manner inside a piston chamber 25 of the inner volume control valve 20. The piston 24 divides the piston chamber 25 into a first chamber 25a and a second chamber 25b.

The air supply source 70 supplies air to the valve air control circuit 60 via the air passage 53. Before and after dispensing hot melt, the valve air control circuit 60 supplies air to the first chamber 25a of the piston chamber 25 via the air passage 52 and the speed controller 22. Meanwhile, air in the second chamber 25b of the piston chamber 25 is sent to the valve air control circuit 60 via the speed controller 21 and the air passage 51, and is discharged from the valve air control circuit 60 to the atmosphere. The pressure inside the first chamber 25a is higher than the pressure inside the second chamber 25b, so the piston 24 moves to shrink the second chamber 25b and expand the first chamber 25a. Because of the movement of the piston 24, the tip of the plunger 23 moves in the direction of increasing distance from the junction 11h of the nozzle body 11, to a retracted position inside the cylinder 11c. When this movement occurs, the plunger 23 sucks the hot melt that is inside the second hot melt passage 11g through the junction 11h and to the cylinder 11c. This is usually called a suck-back function. The suck-back function increases the volume of the hot melt passage inside the nozzle body 11, thereby improving termination when hot melt dispensing stops.

Furthermore, the speed controllers 21 and 22, operating as aperture valves, control the movement speed of the piston 24 by adjusting the flow of air.

The hot melt supply valve 30 is fixed to the nozzle body 11 by the nut 31. A hot melt chamber 32 is provided in the hot melt supply valve 30. The hot melt chamber 32 communicates with an inlet port 33 where hot melt flows in, and with a dispensing port 34 for dispensing hot melt. The gun 40 is fixed to the hot melt supply valve 30. The gun 40 includes a gun hot melt passage 41. One end of the gun hot melt passage 41 communicates with the inlet port 33 of the hot melt supply valve 30, and the other end of the gun hot melt passage 41 communicates with the supply hot melt passage 54 connected to the hot melt supply source 80. Hot melt from the hot melt supply source 80 passes through the supply hot melt passage 54, the gun hot melt passage 41 of the gun 40, and the inlet port 33 and is then supplied to the hot melt chamber 32. The hot melt supply valve 30 includes a valve rod 35 that moves in a reciprocating manner inside the hot melt chamber 32. One end of the valve rod 35 touches and separates from a valve seat 36 provided near the discharge port 34. The other end of the valve rod 35 is fixed to a piston 37. The piston 37 divides a piston chamber 38 into a first chamber 38a and a second chamber 38b. The first chamber 38a communicates with one end of the air passage 42 of the gun 40. The other end of the air passage 42 communicates with the air passage 55 connected to the gun air control circuit 90. Before and after dispensing hot melt, the gun air control circuit 90 releases the first chamber 38a of the piston chamber 38 to the atmosphere via the air passage 55 and the air passage 42 of the gun 40. The second chamber 38b of the piston chamber 38 is provided with a spring 39 for energizing the piston 37. The piston 37 is pushed by the energizing force of the spring 39, touches one end of the valve rod 35 to the valve seat 36, and closes the dispensing port 34. Therefore, dispensing of hot melt inside the hot melt chamber 32 from the dispensing port 34 is prevented.

Operation During Dispensing

Figure 36:
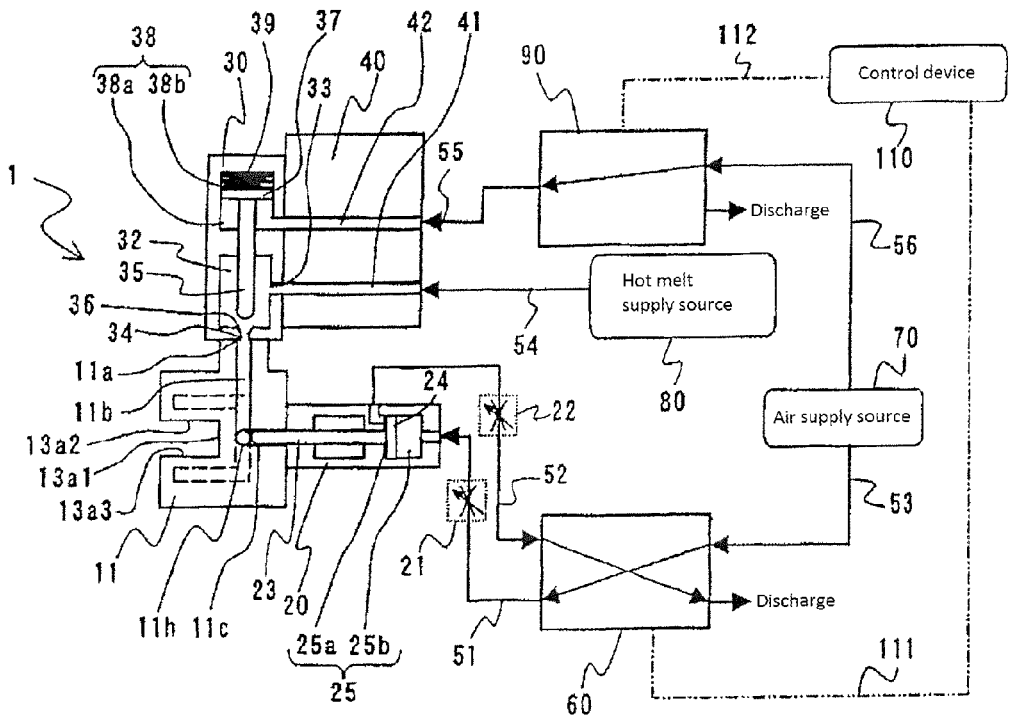
FIG. 36 is a view showing the inner volume control valve and hot melt supply valve of FIG. 35 during a dispensing cycle.

FIG. 36 is a view showing the inner volume control valve 20 and the hot melt supply valve 30 during hot melt dispensing. When dispensing hot melt, the control device 110 controls the valve air control circuit 60 using the first air control signal 111, and supplies air from the air supply source 70 to the air passage 51. Air is supplied to the second chamber 25b of the piston chamber 25 via the air passage 51 and the spin controller 21. Meanwhile, the second chamber 25b expands and the first chamber 25a shrinks as the piston 24 moves. Because of this movement of the piston 24, the tip of the plunger 23 extends and moves to a position near the junction 11h. As a result, the volume inside the cylinder 11c becomes small.

The control device 110 controls the gun air control circuit 90 using the second air control signal 112, and air from the air supply source 70 is supplied to the air passage 42. Air is supplied to the first chamber 38a of the piston chamber 38, and expands the first chamber 38a by moving the piston 37 against the energizing force of the spring 39 in the second chamber 38b. Because of movement of the piston 37, the valve rod 35 separates from the valve seat 36 and opens the dispensing port 34. Hot melt in the hot melt chamber 32 is dispensed from the dispensing port 34 to the inlet opening 11a of the nozzle body 11. Hot melt passes from the outlet opening 11f of the nozzle body 11 through the vertical elongated bore 12a1, the upper lateral elongated bore 12a2, and the lower lateral elongated bore 12a3 of the distribution plate 12, and is then dispensed from the first slot 13a1, the second slot 13a2, and the third slot 13a3.

Coating Method

Figure 37:
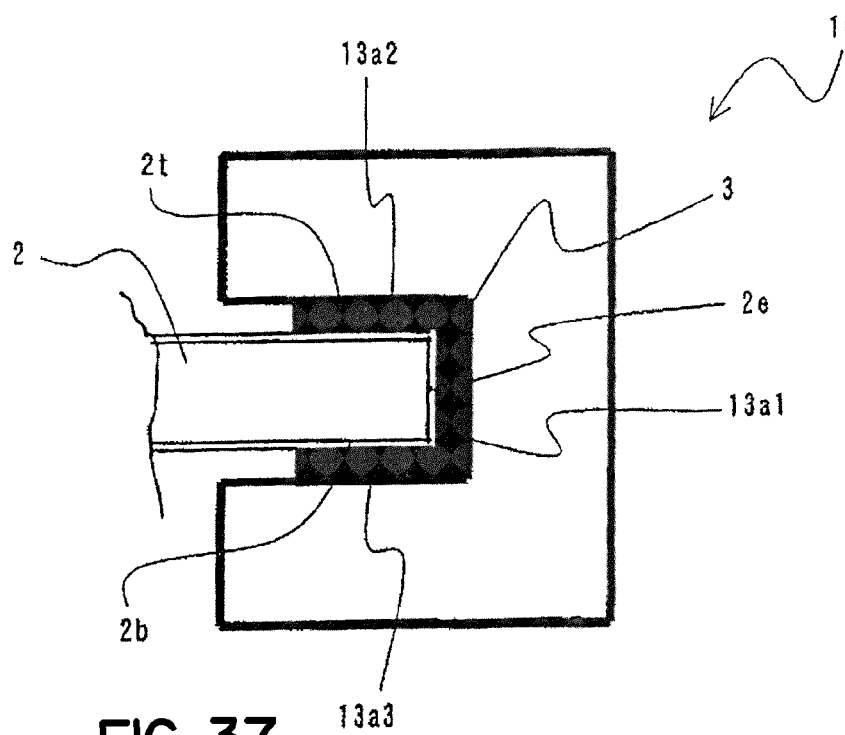
FIG. 37 is a cross-section view of a hot melt coating film coated on a solar cell panel using the three-face coating nozzle of FIG. 2.

FIG. 37 is a cross-section view of a hot melt coating film 3 coated on a solar cell panel 2 using the three-face coating nozzle 10 of Embodiment 1. It is also a cross-sectional view taken along line XXXVII-XXXVII in FIG. 38. In the three-face coating nozzle 10, the cross-section of the portion where the slot is formed is U-shaped. Hot melt dispensed from the first slot 13a1 of the three-face coating nozzle 10 is dispensed on the end face 2e of the solar cell panel 2. In the same way, hot melt dispensed from the second slot 13a2 is dispensed on the upper face 2t of the end of the solar cell panel 2. And hot melt dispensed from the third slot 13a3 is dispensed on the lower face 2b of the end of the solar cell panel 2. The first, second, and third slots 13a1, 13a2, and 13a3 are continuous, so the coating film 3 dispensed on the upper face 2t, end face 2e, and lower face 2b of the end of the solar cell panel 2 is continuous. Therefore, the coating film 3 is a coating film formed without seams.

Figure 38:
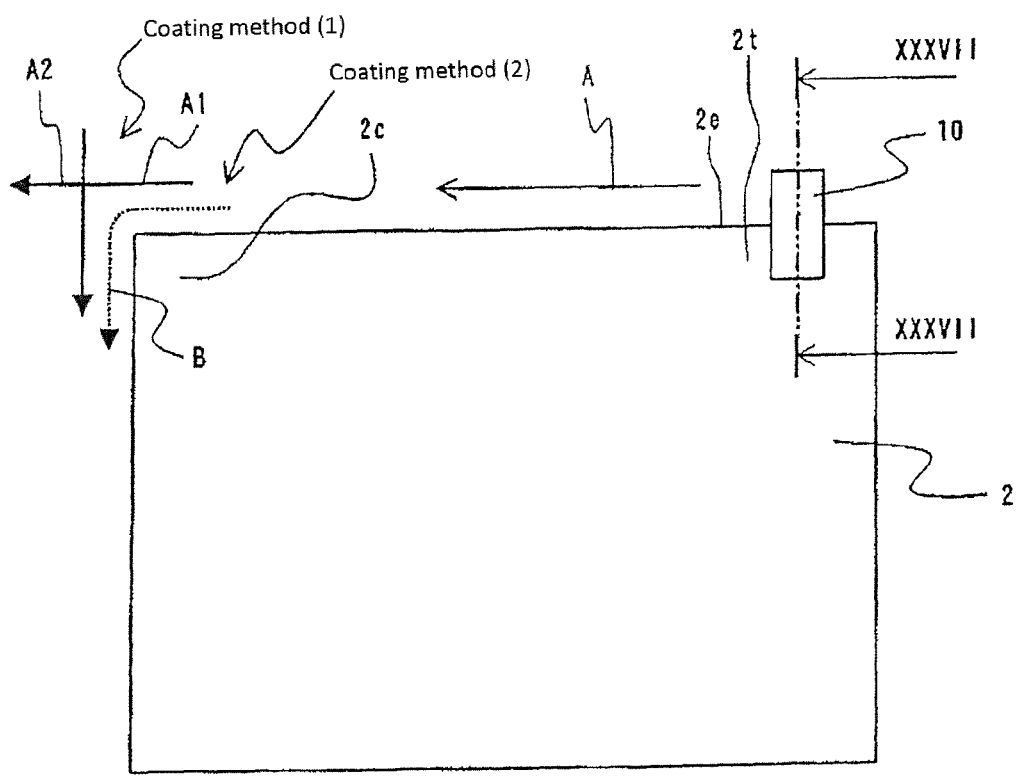
FIG. 38 is an explanatory view showing the hot melt coating method.

FIG. 38 is an explanatory view showing the hot melt coating method. The solar cell panel 2 is transported to a predetermined position by a transport device such as a belt conveyor (not shown in the drawings), and fixed at the predetermined position by a fixing device (not shown in the drawings). The four edges of the solar cell panel 2 are coated with hot melt by the three-face coating nozzle 10. The three-face coating nozzle 10 coats hot melt while being moved in nozzle movement direction A. Hot melt, as shown in FIG. 37, is dispensed from the first, second, and third slots 13a1, 13a2, and 13a3 and is dispensed on the upper face 2t, end face 2e, and lower face 2b of the end of the solar cell panel 2. When coating a corner 2c of the solar cell panel 2, there are two coating methods. In the first coating method, the three-face coating nozzle 10 moves in nozzle movement direction A1 and temporarily overshoots the corner 2c. When this occurs, dispensing hot melt is temporarily halted. Next, the three-face coating nozzle 10 is rotated 90°. The three-face coating nozzle is moved in nozzle movement direction A2, and dispensing hot melt is restarted at the corner 2c of the solar cell panel 2. In the second coating method, while the three-face coating nozzle 10 is coating hot melt at the corner 2c it is rotated 90° to the left, as indicated by arrow B, without separating from the panel 2.

The four edges of the solar cell panel 2 are coated with hot melt by repeating the coating methods. When dispensing ends, the panel 2 is transported by the transport device. In the case of continuous coating, the next panel 2 is transported to the predetermined position by the transport device and fixed by the fixing device. By repeating the same sort of operation, hot melt is coated on the four edges of a plurality of panels 2 continuously. According to this embodiment, U-shaped coating (three-face coating) can be performed in a single step on one edge of a panel, so this operation speeds up a production line and increases the amount of production.

Dimension Changes

With a conventional nozzle, when the coating width of the hot melt or the dimensions of the substrate change it is necessary to remake the nozzle itself. In contrast, the coating nozzle 10 of this embodiment can handle changing dispensing widths of the hot melt or changing dimensions of the substrate simply by changing the dimensions of the distribution plate and shim plate. Thus, the nozzle 10 can handle a wider range of dimensions than a conventional nozzle, without remaking the nozzle body. More specifically, a single coating nozzle can be applied to dispensing hot melt on many types of substrates, which is economically advantageous.

The coating nozzle of this embodiment is not limited to a U shape; complicated curved-surface shapes may also be used in other embodiments. As described above, the coating nozzle 10 of this embodiment can dispense a liquid on the end face of a substrate and on the faces of the substrate adjacent to the end face, so it is possible to reduce the expense of providing a plurality of nozzles, a plurality of liquid supply valves, and a plurality of liquid supply passages. Also, the coating nozzle of this embodiment can reduce the number of structural components compared to a coating device that uses a plurality of conventional coating nozzles, and can reduce the space for installing the coating device. Furthermore, the coating nozzle of this embodiment can reduce the number of liquid supply passages from the liquid supply source to the coating device compared to a coating device that uses a plurality of conventional coating nozzles.

Moreover, the coating nozzle of this embodiment can reduce the time spent in attaching, positioning, and adjusting coating nozzles, and the time spent in adjusting the timing of starting stopping dispensing compared to a coating device that uses a plurality of conventional coating nozzles. Additionally, the coating nozzle of this embodiment can perform coating without forming seams between the coating film at the end face of the substrate and the coating films at the faces of the substrate adjacent to the end face. Therefore, it is possible to create a coating with a desirable appearance. In addition, the coating nozzle of this embodiment uses an inner volume control valve, so it can create a desirable termination or "cut-off" when dispensing ends. Also, stringing of hot melt after coating ends can be reduced. Furthermore, the coating nozzle of this embodiment includes a temperature adjustment heater and a temperature sensor, so it can perform dispensing consistent with the characteristics of a wide range of materials and ranging from low temperature to high temperature.

Figure 39:
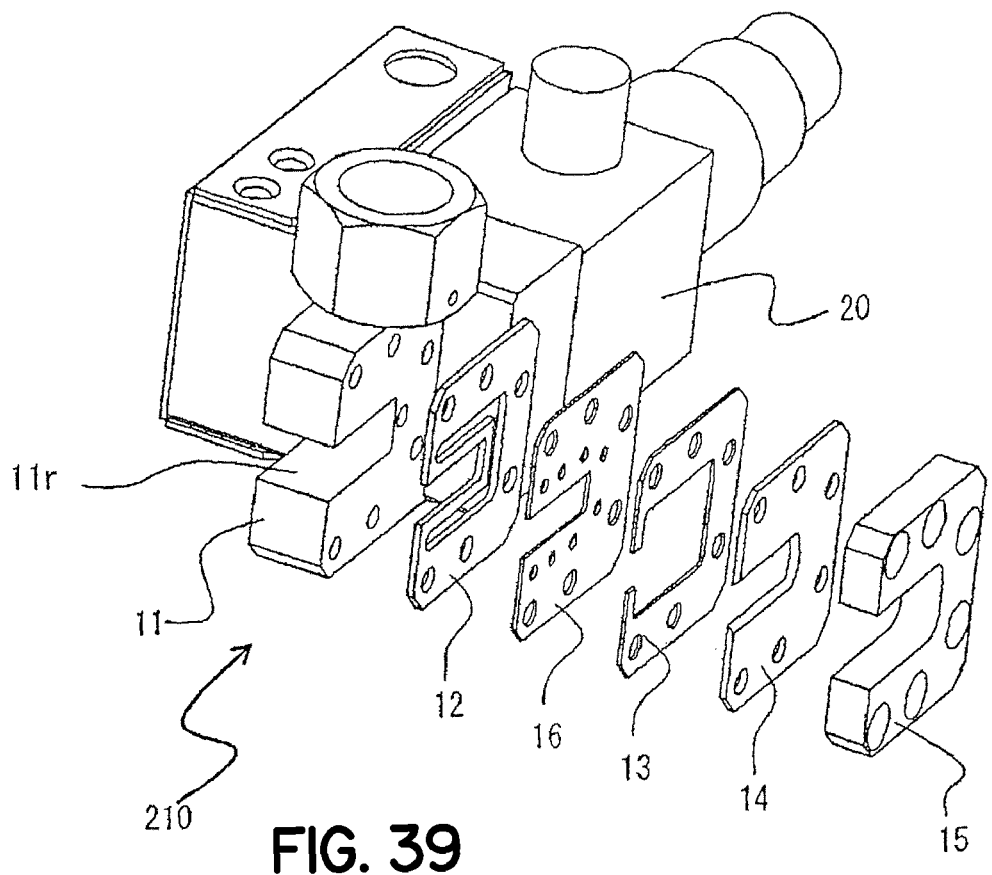
FIG. 39 is an exploded perspective view of a three-face coating nozzle according to a second embodiment of the coating system.

FIG. 39 is an exploded perspective view of a three-face coating nozzle 210 according to a second embodiment of the invention. In the three-face coating nozzle 10 shown in FIG. 2, the shim plate 13 was attached adjacent to the distribution plate 12. In this embodiment a dispersion plate 16 is provided between the distribution plate 12 and the shim plate 13. The three-face coating nozzle 210 of this embodiment has the same elements as the three-face coating nozzle 10 of the first embodiment, except for the dispersion plate 16. Consequently, the same reference numbers are applied to the same elements, and explanation thereof is largely omitted.

Dispersion Plate

Figure 40:
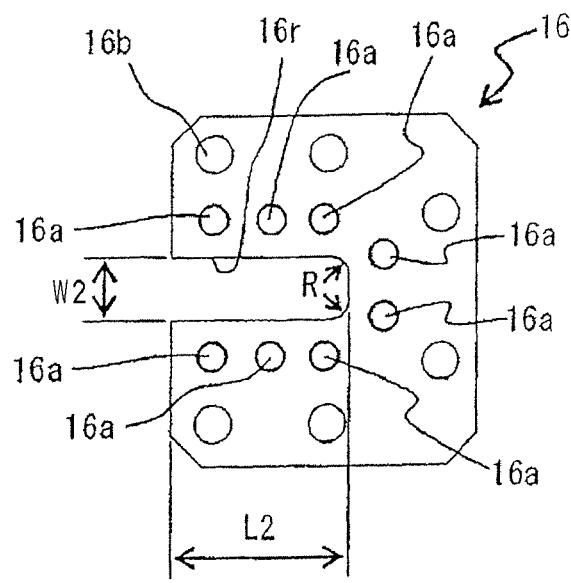
FIG. 40 is a front elevation view of the dispersion plate used with the second embodiment of the coating system.

FIG. 40 is a front elevation view of the dispersion plate 16. The dispersion plate 16 includes a cutout 16r for passage of the solar cell panel 2. The cutout 16r has a width W2 and a length L2. The top side of the cutout 16r and the intermediate side are joined by an arc with radius R, and the lower side of the cutout 16r and the intermediate side are joined by an arc with radius R. The width W2, the length L2, and radius R of the cutout 16r are equal to width W2, length L2, and radius R of the distribution plate 12.

A plurality of through bores 16a are provided in the dispersion plate 16 at portions corresponding to the vertical elongated bore 12a1, the upper lateral elongated bore 12a2, and the lower lateral elongated bore 12a3 of the distribution plate 12. In this embodiment, eight through bores 16a are provided. The plurality of through bores 16a in the dispersion plate 16 improve the dispersion of hot melt flowing from the vertical elongated bore 12a1, the upper lateral elongated bore 12a2, and the lower lateral elongated bore 12a3 of the distribution plate 12 to the second cutout 13a of the shim plate 13. As a result, the dispersion plate 16 promotes uniform flow of hot melt from the distribution plate 12 to the shim plate 13. Six holes 16b for receiving attachment screws 4 are provided in the dispersion plate 16.

Figure 41:
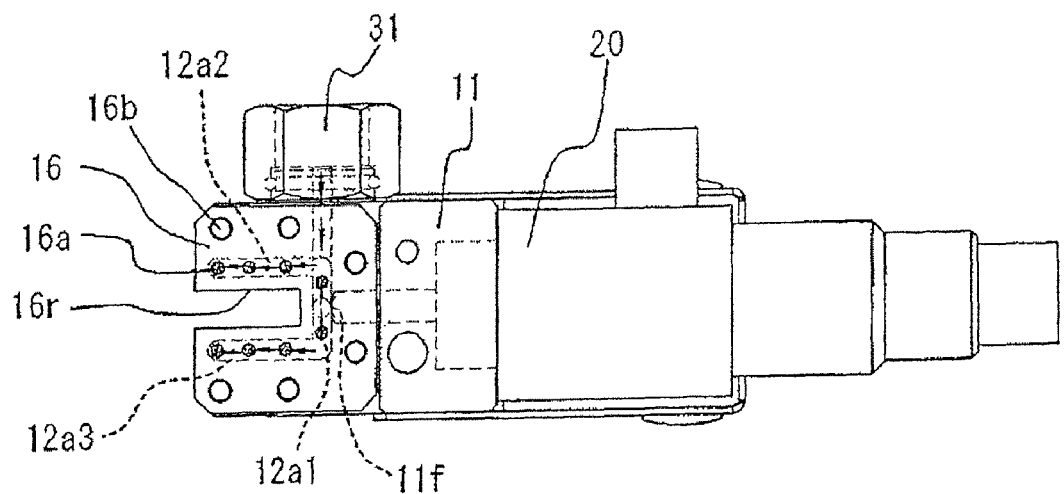
FIG. 41 is a front elevation view of the dispersion plate of FIG. 40 attached adjacent to a distribution plate.
Figure 42:
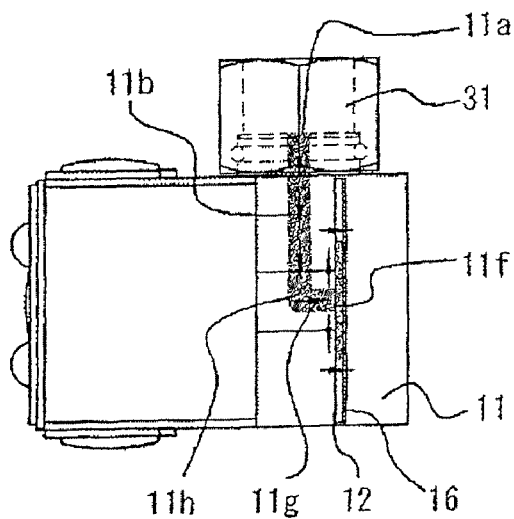
FIG. 42 is a side elevation view of the dispersion plate attached adjacent to the distribution plate of FIG. 41.
Figure 43:
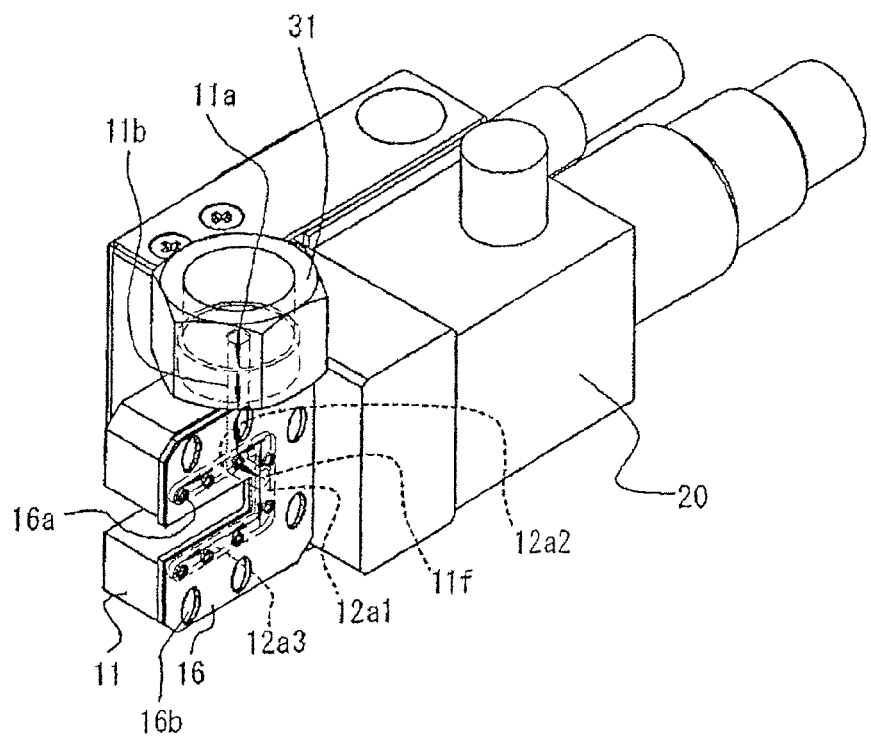
FIG. 43 is a perspective view of the dispersion plate attached adjacent to the distribution plate of FIG. 41.

FIG. 41, FIG. 42, and FIG. 43 are, respectively, a front elevation view, a side elevation view, and a perspective view of the dispersion plate 16 attached adjacent to the distribution plate 12. Hot melt dispensed from the outlet opening 11*f* of the nozzle body 11 flows to the upper lateral elongated bore 12*a*2 and the lower lateral elongated bore 12*a*3 via the vertical elongated bore 12*a*1 of the distribution plate 12. Because of the dispersion plate 16, hot melt can sufficiently flow to the ends of the upper lateral elongated bore 12*a*2 and lower lateral elongated bore 12*a*3.

Figure 44:
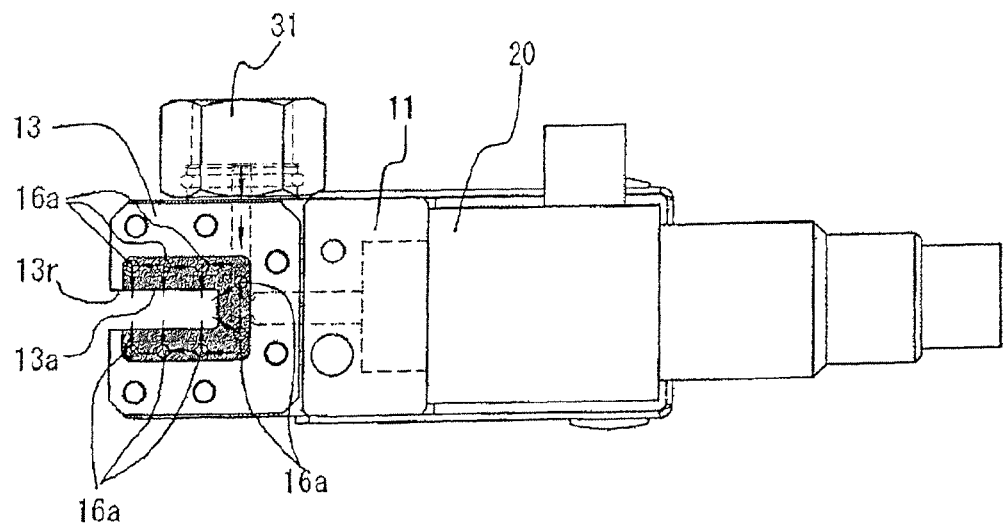
FIG. 44 is a front elevation view of a shim plate attached adjacent to the dispersion plate of FIG. 40.
Figure 45:
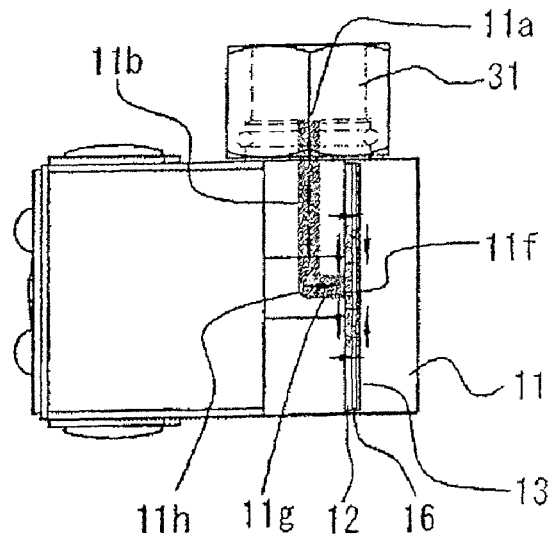
FIG. 45 is a side elevation view of the shim plate of FIG. 44 attached adjacent to the dispersion plate of FIG. 40.
Figure 46:
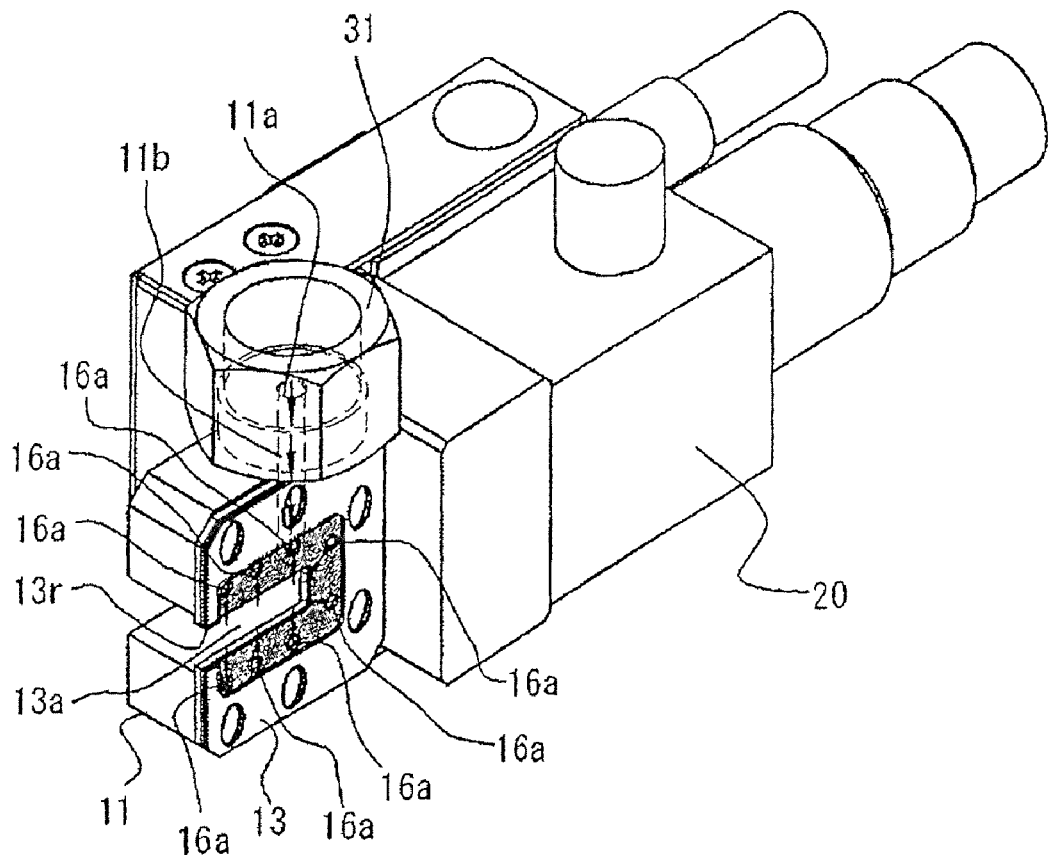
FIG. 46 is a perspective view of the shim plate attached adjacent to the dispersion plate of FIG. 40.

FIG. 44, FIG. 45, and FIG. 46 are, respectively, a front elevation view, a side elevation view, and a perspective view of the shim plate 13 attached adjacent to the dispersion plate 16. Hot melt flows from the eight through bores 16*a* provided in the dispersion plate 16 to the second cutout 13*a* of the shim plate 13. As a result, hot melt flowing in the first, second, and third slots 13*a*1, 13*a*2, and 13*a*3 formed by the second cutout 13*a* of the shim plate 13 is made uniform.

Hot Melt Flow Passage

Figure 47:
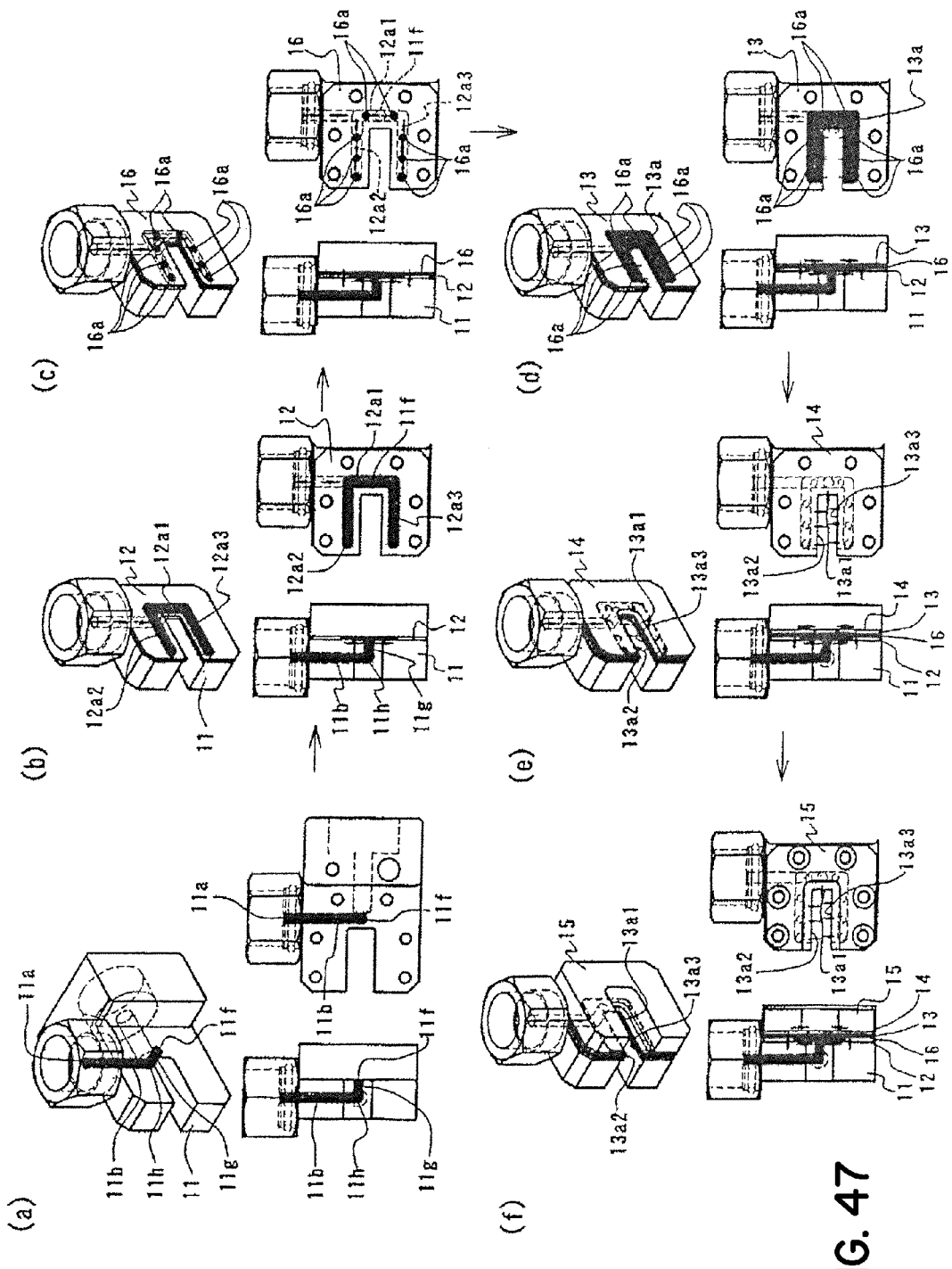
FIGS. 47(*a*)-(*f*) are collectively an explanatory view showing the hot melt flow passage of the three-face coating nozzle of FIG. 39.

FIGS. 47(*a*)-47(*f*) are collectively an explanatory view showing the hot melt flow passage of the three-face coating nozzle 210 of the second embodiment. FIG. 47(*a*) is a view showing the hot melt flow passage of the nozzle body 11. Hot melt flows from the inlet opening 11*a*, through the first hot melt passage 11*b*, to the junction 11*h*. At this time, the tip of the plunger 23 of the inner volume control valve 20 is near the junction 11*h*. Hot melt flows from the junction 11*h*, through the second hot melt passage 11*g*, and to the outlet opening 11*f*. FIG. 47(*b*) is a view showing the hot melt flow passage of the distribution plate 12. Hot melt from the exit opening 11*f* is dispensed to the vertical elongated bore 12*a*1 of the distribution plate 12. Hot melt is distributed to the top and bottom of the vertical elongated bore 12*a*1. Hot melt distributed to the top flows inside the upper lateral elongated bore 12*a*2 and fills the upper lateral elongated bore 12*a*2. Hot melt distributed to the bottom flows inside the lower lateral elongated bore 12*a*3 and fills the lower lateral elongated bore 12*a*3.

FIG. 47(*c*) shows the hot melt flow passage of the dispersion plate 16. Because of the dispersion plate 16, hot melt can sufficiently flow to the ends of the upper lateral elongated bore 12*a*2 and the lower lateral elongated bore 12*a*3. Hot melt flows from the vertical elongated bore 12*a*1, the upper lateral elongated bore 12*a*2, and the lower lateral elongated bore 12*a*3, through the plurality of through bores 16*a* of the dispersion plate 16, to the second cutout 13*a* of the shim plate 13. FIG. 47(*d*) shows the hot melt flow passage of the shim plate 13. Hot melt dispensed from the plurality of through bores 16*a* of the dispersion plate 16 uniformly spreads inside the second cutout 13*a* of the shim plate 13. FIG. 47(*e*) shows the operational state when the second cutout 13*a* of the shim plate 13 is covered by the baffle plate 14. Hot melt is dispensed from the first, second, and third slots 13*a*1, 13*a*2, and 13*a*3 formed by the second cutout 13*a* of the shim plate 13. FIG. 47(*f*) shows the operational state when the attachment plate 15 is attached.

In the second embodiment, the dispersion plate 16, which includes a plurality of through bores 16*a*, is disposed between the distribution plate 12 and the shim plate 13, so the dispersion of hot melt inside the three-face coating nozzle 210 becomes uniform. As a result, the coating film thickness of hot melt coated on the solar cell panel 2 becomes uniform.

Figure 48:
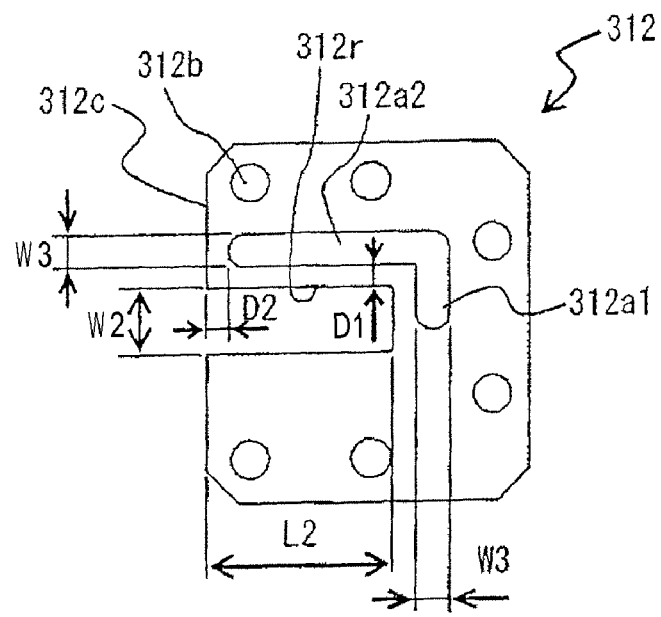
FIG. 48 is a front elevation view of a distribution plate for the two-face coating nozzle according to a third embodiment of the coating system.
Figure 49:
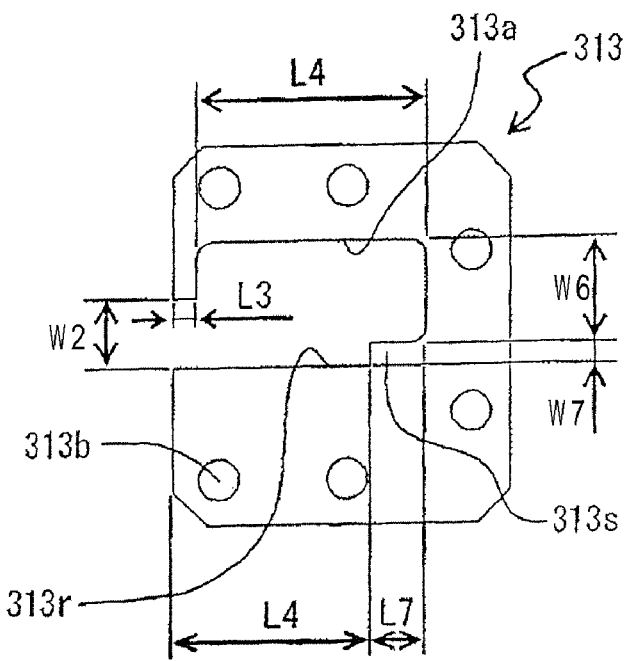
FIG. 49 is a front elevation view of a shim plate for the two-face coating nozzle of FIG. 48.

According to the present invention, it is possible to change the three-face coating nozzles 10 and 210 of the first and second embodiments to two-face coating nozzles just by replacing the distribution plate and the shim plate. FIG. 48 and FIG. 49 are, respectively, front elevation views of a distribution plate 312 and shim plate 313 for a two-face coating nozzle according to a third embodiment of the invention.

The distribution plate 312 includes a cutout 312*r* for receiving the solar cell panel 2. Like the distribution plate 12 shown in FIG. 9, the cutout 312*r* has a width W2 and a length L2. An L-shaped elongated bore 312*a* is provided in the distribution plate 312 at the periphery of the cutout 312*r*. A vertical elongated bore 312*a*1 is provided in the distribution plate 312 extending upward from a position facing the outlet opening 11*f* of the nozzle body 11 when the distribution plate 312 is attached to the nozzle body 11. Also, an upper lateral elongated bore 312*a*2 is provided in the distribution plate 312 extending from the upper end of the vertical elongated bore 312*a*1 along the upper side of the cutout 312*r*. The elongated bore 312*a* (312*a*1, 312*a*2) has a width W3. A distance D1 defined between the cutout 312*r* and the elongated bore 312*a* determines the length of the flow passage of the slot that dispenses hot melt. Six holes 312*b* for passage of attachment screws are provided in the distribution plate 312.

The shim plate 313 includes a first cutout 313*r* for receiving the solar cell panel 2. The first cutout 313*r* has a width W2, an upper side length L3, and a lower side length L2. The width W2 and the lower side length L2 of the first cutout 313*r* are respectively equal to the width W2 and the length L2 of the cutout 312*r* of the distribution plate 312. The upper side length L3 of the first cutout 313*r* is equal to the distance D2 from the left end 312*c* of the distribution plate 312 to the end of the upper lateral elongated bore 312*a*2. However, the dimensions of the first cutout 313*r* are not limited to this.

The shim plate 313 also includes a second cutout 313*a*. The second cutout 313*a* communicates with the first cutout 313*r*. The second cutout 313*a* has a width W6 and a length L4. The width W6 is equal to the length of the vertical elongated bore 312*a*1 of the distribution plate 312. The length L4 is equal to the length of the upper lateral elongated bore 312*a*2 of the distribution plate 312. However, the dimensions of the second cutout 313*a* are not limited to this. In this embodiment, the dimensions are such that when the shim plate 313 is adjacent to the distribution plate 312, the second cutout 313*a* includes the vertical elongated bore 312*a*1 and the upper lateral elongated bore 312*a*2.

A step 313*s* is provided between the first cutout 313*r* and the second cutout 313*a*. The step 313*s* has a width W7 and a length L7. The width W7 determines the length of the slot that dispenses hot melt onto the end face 2*e* of the solar cell panel 2. The length L7 is equal to the width W3 of the elongated bore 312*a* added to the distance D1 defined between the cutout 312*r* and the elongated bore 312*a* of the distribution plate 312. However, the dimensions of the step 313*s* are not limited to this. Six holes 313*b* for passage of attachment screws are provided in the shim plate 313.

The distribution plate 312, the shim plate 313, the baffle plate 14, and the attachment plate 15 are coupled to the nozzle body 11 by screws 4, thereby forming the two-face coating nozzle. A slot for coating the end face 2*e* and upper face 2*t* (or lower face 2*b*) of the solar cell panel 2 is formed in the two-face coating nozzle. Furthermore, the dispersion plate 16 of the second embodiment may also be inserted between the distribution plate 312 and shim plate 313. In this manner, according to the present invention, a three-face coating nozzle can be changed to a two-face coating nozzle just by replacing the distribution plate and the shim plate.

Figure 50:
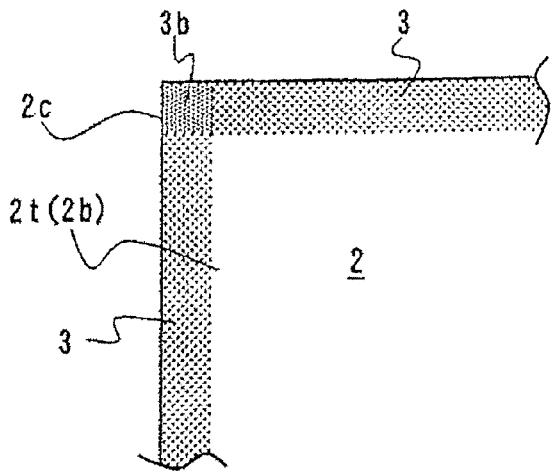
FIG. 50 is a view showing a solar cell panel coated with hot melt.

Using the coating nozzles of any of the first three embodiments and the method of FIG. 38, hot melt is dispensed on the end face 2*e* and the upper face 2*t* and/or the lower face 2*b* of the solar cell panel 2. FIG. 50 is a view showing the solar cell panel 2 coated with hot melt according to one of the first three described embodiments. The coating film 3 of hot melt coated on the upper face 2*t* and/or the lower face 2*b* of the solar cell panel 2 creates a coating film overlap portion 3*b* at the corner 2*c* of the panel 2. The coating film overlap portion 3*b* makes the coating film non-uniform, and is associated with excess consumption of hot melt. The multi-face coating device according to a fourth embodiment of the invention and described below prevents the occurrence of the coating film overlap portion 3b.

Figure 51:
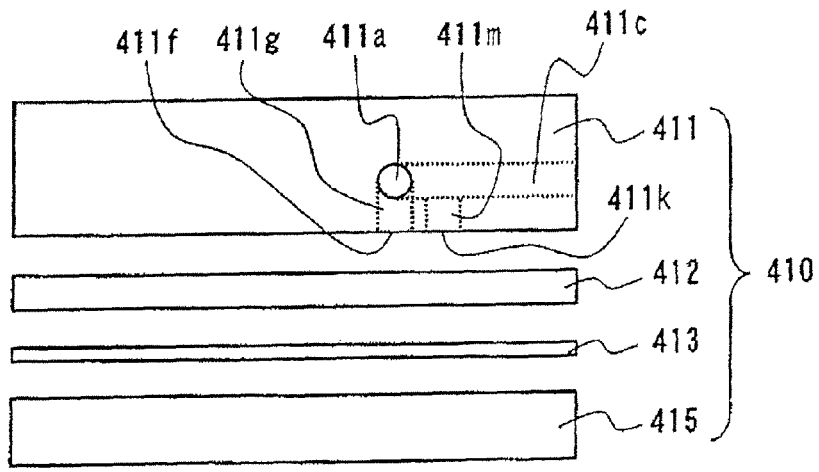
FIG. 51 is an exploded view of the three-face coating nozzle according to a fourth embodiment of the coating system.

The multi-face coating device of the fourth embodiment includes the same elements as the coating device of the first embodiment, except for the coating nozzle and the inner volume control valve. Thus, the same reference numbers are applied to the same elements, and further explanation thereof is omitted. FIG. 51 is an exploded view of a three-face coating nozzle 410 according to this fourth embodiment of the invention. The three-face coating nozzle 410 includes a nozzle body 411, a distribution plate 412, a shim plate 413, and an attachment plate 415. The attachment plate 415 of the fourth embodiment also acts as the baffle plate of the first embodiment. However, a baffle plate may be provided between the shim plate 413 and the attachment plate 415. Also, in the same manner as the second embodiment, a dispersion plate may be inserted between the distribution plate 412 and the shim plate 413.

Nozzle Body

Figure 52:
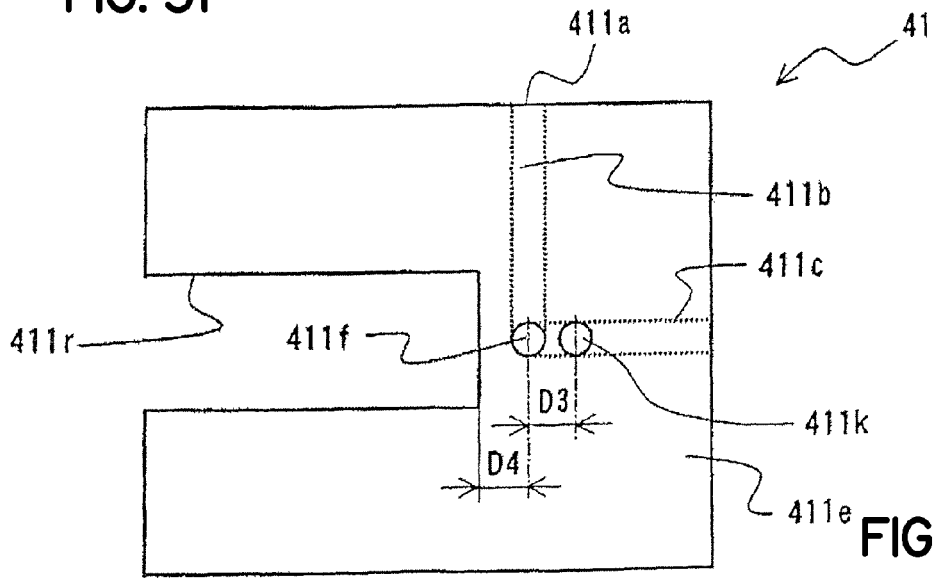
FIG. 52 is a front elevation view of the nozzle body of nozzle of FIG. 51.
Figure 53:
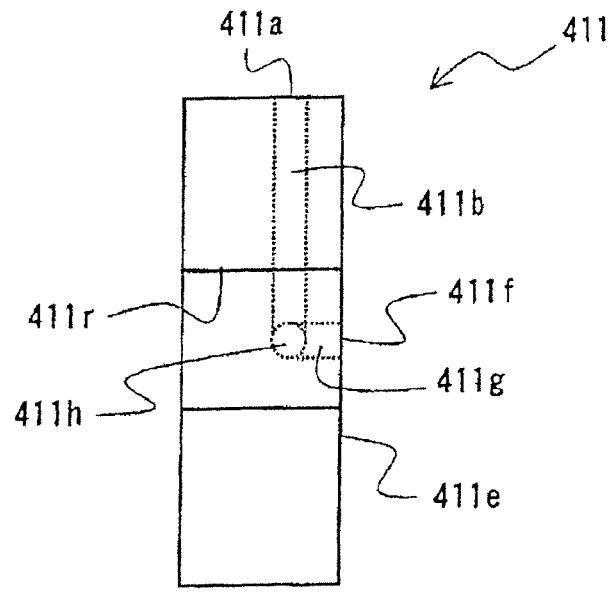
FIG. 53 is a side elevation view of the nozzle body of the nozzle of FIG. 51.

As shown in FIG. 51, the nozzle body 411 is provided with an inlet opening 411a supplied with hot melt. FIG. 52 and FIG. 53 are, respectively, a front elevation view and a side elevation view of the nozzle body 411. The nozzle body 411 is provided with a cutout 411r for receiving the solar cell panel 2. The nozzle body 411 is provided with a first hot melt passage 411b communicating with the inlet opening 411a. Also, a cylinder 411c intersecting the first hot melt passage 411b and communicating with the first hot melt passage 411b and a junction 411h is provided in the nozzle body 411. The cylinder 411c is located at the side opposite the cutout 411r with respect to the first hot melt passage 411b. A first outlet opening 411f and a second outlet opening 411k for hot melt are located in the attachment face 411e of the nozzle body 411, to which the distribution plate 412 is attached. The center of the first outlet opening 411f and the center of the second outlet opening 411k are separated by a distance D3. The center of the first outlet opening 411f and the side of the cutout 411r are separated by a distance D4. The first outlet opening 411f communicates with the junction 411h via a second hot melt passage 411g. The second outlet opening 411k communicates with the cylinder 411c via a third hot melt passage 411m.

Distribution Plate

Figure 54:
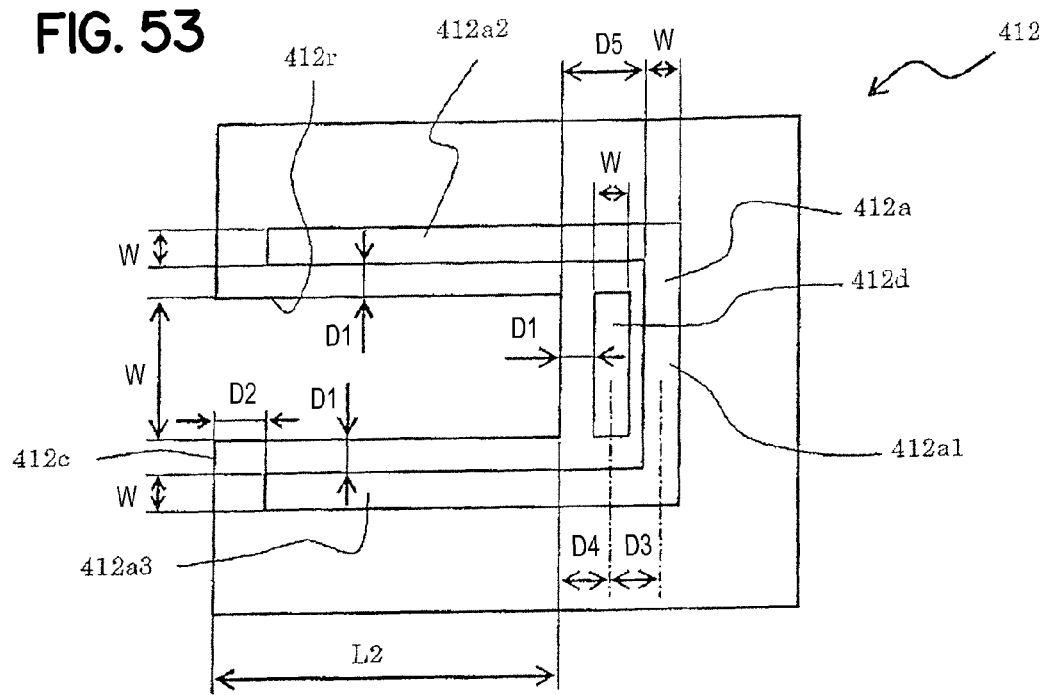
FIG. 54 is a front elevation view of a distribution plate used with the fourth embodiment of the coating system.

FIG. 54 is a front elevation view of the distribution plate 412. The distribution plate 412 includes a cutout 412r for receiving the solar cell panel 2. The cutout 412r has a width W2 and a length L2. The distribution plate 412 is provided with a U-shaped second elongated bore 412a along the periphery of the cutout 412r. The second elongated bore 412a, as shown in FIG. 54, comprises a vertical elongated bore 412a1; an upper lateral elongated bore 412a2, which extends horizontally from one end of the vertical elongated bore 412a1 along the upper side of the cutout 412r; and a lower lateral elongated bore 412a3, which extends horizontally from the other end of the vertical elongated bore 412a1 along the lower side of the cutout 412r. The second elongated bore 412a has a width W3. The upper side of the cutout 412r and the upper lateral elongated bore 412a2 are separated by a distance D1. Similarly, the lower side of the cutout 412r and the lower lateral elongated bore 412a3 are separated by a distance D1. The side of the cutout 412r and the vertical elongated bore 412a1 are separated by a distance D5. The end of the upper lateral elongated bore 412a2 and the end of the lower lateral elongated bore 412a3, and the left end 412c of the distribution plate 412 are separated by a distance D2. A second vertical elongated bore 412d is provided between the side of the cutout 412r and the vertical elongated bore 412a1. The second vertical elongated bore 412d is a linear-shaped elongated bore with a width W3. The length of the second vertical elongated hole 412d is equal to the width W2 of the cutout 412r. However, the dimensions of the second vertical elongated bore 412d are not limited to this.

The side of the cutout 412r and the second vertical elongated bore 412d are separated by a distance D1. The center of the second vertical elongated bore 412d and the center of the vertical elongated bore 412a1 are separated by a distance D3. The center of the second vertical elongated bore 412d and the center of the cutout 412r are separated by a distance D4. Therefore, when the distribution plate 412 is attached to the nozzle body 411, the center of the second vertical elongated bore 412d and the center of the first outlet opening 411f align, and the center of the vertical elongated bore 412a1 and the center of the second outlet opening 411k align. The second vertical elongated bore 412d communicates with the first outlet opening 411f, and the vertical elongated bore 412a1 communicates with the second outlet opening 411k.

Shim Plate

Figure 55:
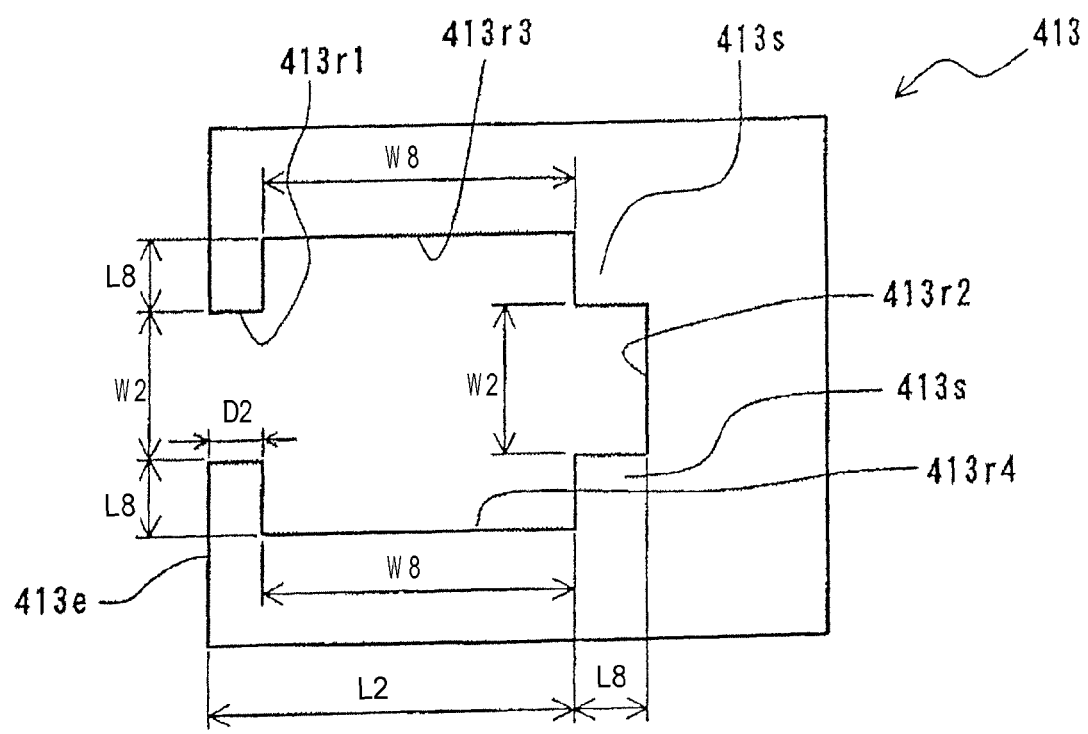
FIG. 55 is a front elevation view of a shim plate used with the fourth embodiment of the coating system.

FIG. 55 is a front elevation view of the shim plate 413. The shim plate 413 includes a first cutout 413r1 for receiving the solar cell panel 2. The first cutout 413r1 has a width W2 and a length L2. However, in order to communicate with another cutout to be described later, the width W2 is separated by a distance D2 from the left end 413c of the shim plate 413. The distance D2 is equal to the distance D2 between the end of the upper lateral elongated bore 412a2 and the end of the lower lateral elongated bore 412a3, and the left end 412c of the distribution plate 412. However, the dimensions of the first cutout 413r1 are not limited to this.

The shim plate 413 also includes a second cutout 413r2, a third cutout 412r3, and a fourth cutout 413r4. The second cutout 413r2, the third cutout 412r3, and the fourth cutout 413r4 respectively communicate with the first cutout 413r1. The second cutout 413r2 has a width W2 and a length L8. The width W2 is equal to the width W2 of the first cutout 413r1. Also, the length L8 is equal to width W3 of the first vertical elongated bore 412d added to the distance D1 defined between the side of the cutout 412r and the first vertical elongated bore 412d. However, the dimensions of the second cutout 413r2 are not limited to this. The second cutout 413r2 forms a first slot 413a1 for working together with the distribution plate 412 and the attachment plate 415 to dispense hot melt at the end face 2e of the solar cell panel 2.

The third cutout 412r3 has a width W8 and a length L8. The width W8 is equal to the distance D2 subtracted from length L2 of the first cutout 413r1. Also, the length L8 is equal to the width W3 of the upper lateral elongated bore 412a2 added to the distance D1 defined between the upper side of the cutout 412r of the distribution plate 412 and the upper lateral elongated bore 412a2. However, the dimensions of the third cutout 412r3 are not limited to this. The third cutout 413r3 forms a second slot 413a2 for working together with the distribution plate 412 and the attachment plate 415 to dispense hot melt at the top face 2t of the solar cell panel 2. Similarly, the fourth cutout 413r4 has a width W8 and a length L8. The width W8 is equal to the distance D2 subtracted from length L2 of the first cutout 413r1. Also, the length L8 is equal to the width W3 of the lower lateral elongated bore 412a3 added to the distance D1 defined between the lower side of the cutout 412r of the distribution plate 412 and the lower lateral elongated bore 412a3. However, the dimensions of the fourth cutout 412r4 are not limited to this. The fourth cutout 413r4 forms a third slot 413a3 for working together with the distribution plate 412 and the attachment plate 415 to dispense hot melt at the lower face 2b of the solar cell panel 2.

A square baffle part 413s with a side length L8 is formed between the second cutout 413r2 and the third cutout 413r3, and also between the second cutout 413r2 and the fourth cutout 413r4. When the shim plate 413 is attached adjacent to the distribution plate 412, the second cutout 413r2, the third cutout 412r3, and the fourth cutout 413r4 communicate directly with the first vertical elongated bore 412d, the upper lateral elongated bore 412a2, and the lower lateral elongated bore 412a3 of the distribution plate 412, respectively. The vertical elongated bore 412a1 of the distribution plate 412 does not communicate directly with any of the first cutout 413r1, the second cutout 413r2, the third cutout 412r3, or the fourth cutout 413r4 of the shim plate 413.

Inner Volume Control Valve

Figure 56:
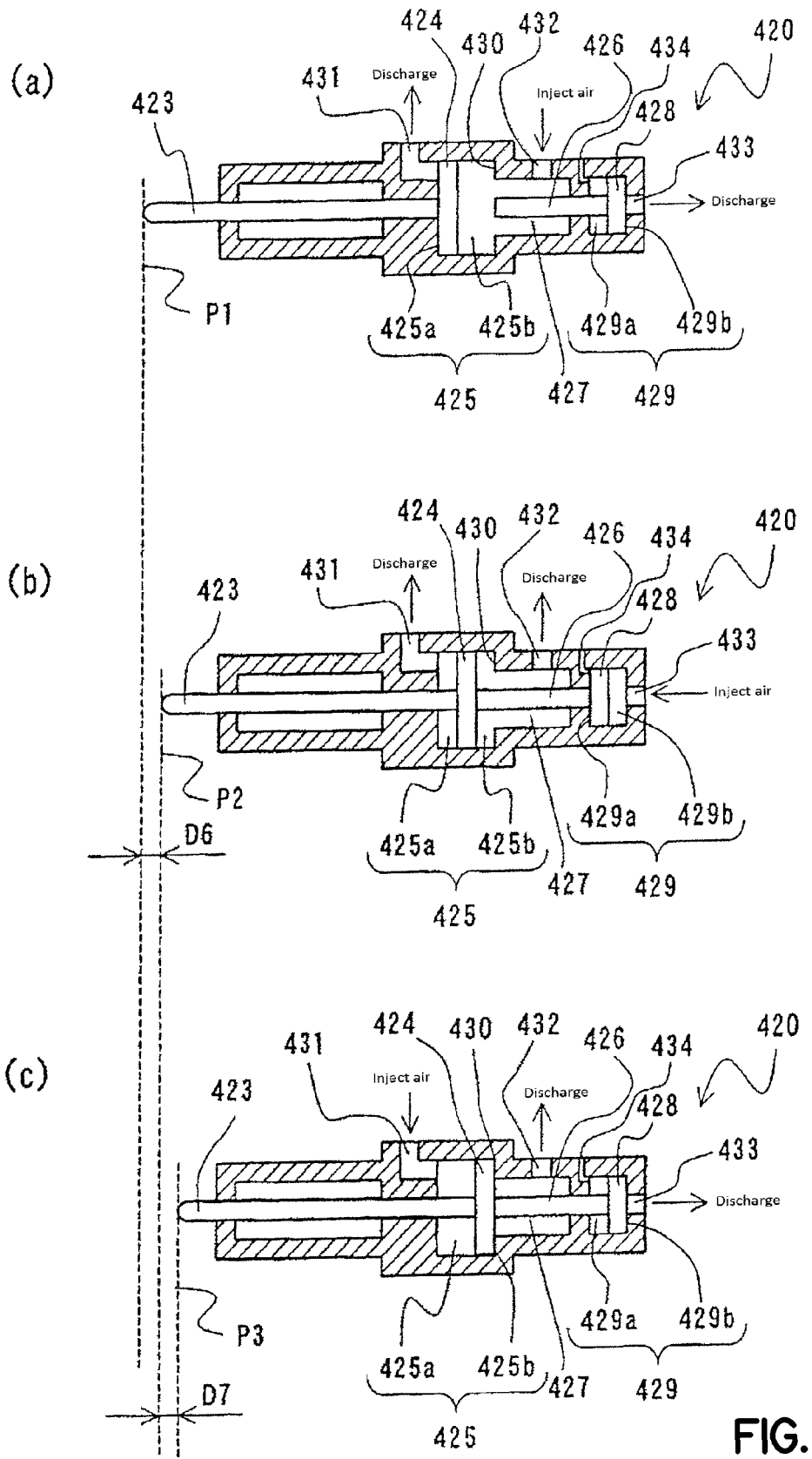
FIGS. 56(a)-56(c) are collectively an explanatory view showing the operation of the inner volume control valve of the nozzle of FIG. 51

Next, the inner volume control valve attached to the nozzle body 411 will be described. FIG. 56 is an explanatory view showing the operation of the inner volume control valve 420 of the fourth embodiment. The inner volume control valve of the first embodiment described above has two control positions: a position at which the tip of the plunger 23 extends, and a retracted position. In contrast to this, the inner volume control valve 420 of the fourth embodiment can be controlled to three positions of a first plunger 423. The first plunger 423 is located in the inner volume control valve 420 so that it can move in a reciprocating manner. One end of the first plunger 423 is inserted into the cylinder 411c of the nozzle body 11. The other end of the first plunger 423 is fixed to a first piston 424. The first piston 424 is located so that it can move in a reciprocating manner inside a first piston chamber 425 of the inner volume control valve 420. The first piston 424 divides the first piston chamber 425 into a first chamber 425a and a second chamber 425b.

In the inner volume control valve 420, a second plunger 426 is provided in a plunger chamber 427 so that it can move in a reciprocating manner. One end of the second plunger 426 can touch the first piston 424. The other end of the second plunger 426 is fixed to a second piston 428. The second piston 428 is located so that it can move in a reciprocating manner inside a second piston chamber 429 of the inner volume control valve 420. The second piston 428 divides the second piston chamber 429 into a first chamber 429a and a second chamber 429b. The second chamber 425b of the first piston chamber 425 communicates with the plunger chamber 427. A shoulder 430 touching the first piston 428 is formed between the second chamber 425b of the first piston chamber 425 and the plunger chamber 427.

A first inlet/outlet port 431, second inlet/outlet port 432, and third inlet/outlet port 433 are provided in the inner volume control valve 420. The first inlet/outlet port 431 communicates with the first chamber 425a of the first piston chamber 425. In this regard, the first inlet/outlet port 431 injects air into and exhausts air from the first chamber 425a. The second inlet/outlet port 432 communicates with the plunger chamber 427. The plunger chamber 427 communicates with the second chamber 425b of the first piston chamber 425, so the second inlet/outlet port 432 injects air into and exhausts air from the second chamber 425b of the first piston chamber 425. The third inlet/outlet port 433 communicates with the second chamber 429b of the second piston chamber 429. In this regard, the third inlet/outlet port 433 injects air into and exhausts air from the second chamber 429b. The first chamber 429a of the second piston chamber 429 also always communicates with a discharge port 434 and is open to the atmosphere.

FIG. 56(a) shows the state when air is injected from the second inlet/outlet port 432 to the second chamber 425b of the first piston chamber 425, air in the first chamber 425a of the first piston chamber 425 is exhausted from the first inlet/outlet port 431, and air in the second chamber 429b of the second piston chamber 429 is exhausted from the third inlet/outlet port 433. Because of the pressure difference between the first chamber 425a and the second chamber 425b of the first piston chamber 425, the first piston 424 moves so as to shrink the first chamber 425a and expand the second chamber 425b. The tip of the first plunger 423 extends due to the movement of the first piston 424 and is at a first position P1.

FIG. 56(b) shows the state when air is injected from the third inlet/outlet port 433 to the second chamber 429b of the second piston chamber 429, air in the first chamber 425a of the first piston chamber 425 is exhausted from the first inlet/outlet port 431, and air in the second chamber 425b of the first piston chamber 425 is exhausted from the second inlet/outlet port 432. Because of the pressure difference between the first chamber 429a and the second chamber 429b of the second piston chamber 429, the second piston 428 moves so as to shrink the first chamber 429a and expand the second chamber 429b. The second plunger 426 extends due to the movement of the second piston 428. The first chamber 425a and the second chamber 425b of the first piston chamber 425 are exhausted, so the pressure difference is not applied to the first piston 424. However, the pressure of hot melt is applied to the first plunger 423 inserted in the cylinder 411c of the nozzle body 411, so the first plunger 423 moves until the first piston 424 touches the second plunger 426. The tip of the first plunger 423 retracts by a distance D6 from the first position P1, and is at a second position P2. The second position P2 is near a second junction where the third hot melt passage 411m joins the cylinder 411c, and where the second outlet opening 411k communicates with the cylinder 411c.

FIG. 56(c) shows the state when air is injected from the first inlet/outlet port 431 to the first chamber 425a of the first piston chamber 425, air in the second chamber 425b of the first piston chamber 425 is exhausted from the second inlet/outlet port 432, and air in the second chamber 429b of the second piston chamber 429 is exhausted from the third inlet/outlet port 433. Because of the pressure difference between the first chamber 425a and the second chamber 425b of the first piston chamber 425, the first piston 424 moves so as to expand the first chamber 425a and shrink the second chamber 425b. In conjunction with the movement of the first piston 424, the second plunger 426, which is touching the first piston 424, also moves. The tip of the first plunger 423 retracts by a distance D7 from the second position P2, and is at a third position P3. At this time, the first piston 424 touches the shoulder 430.

Figure 57:
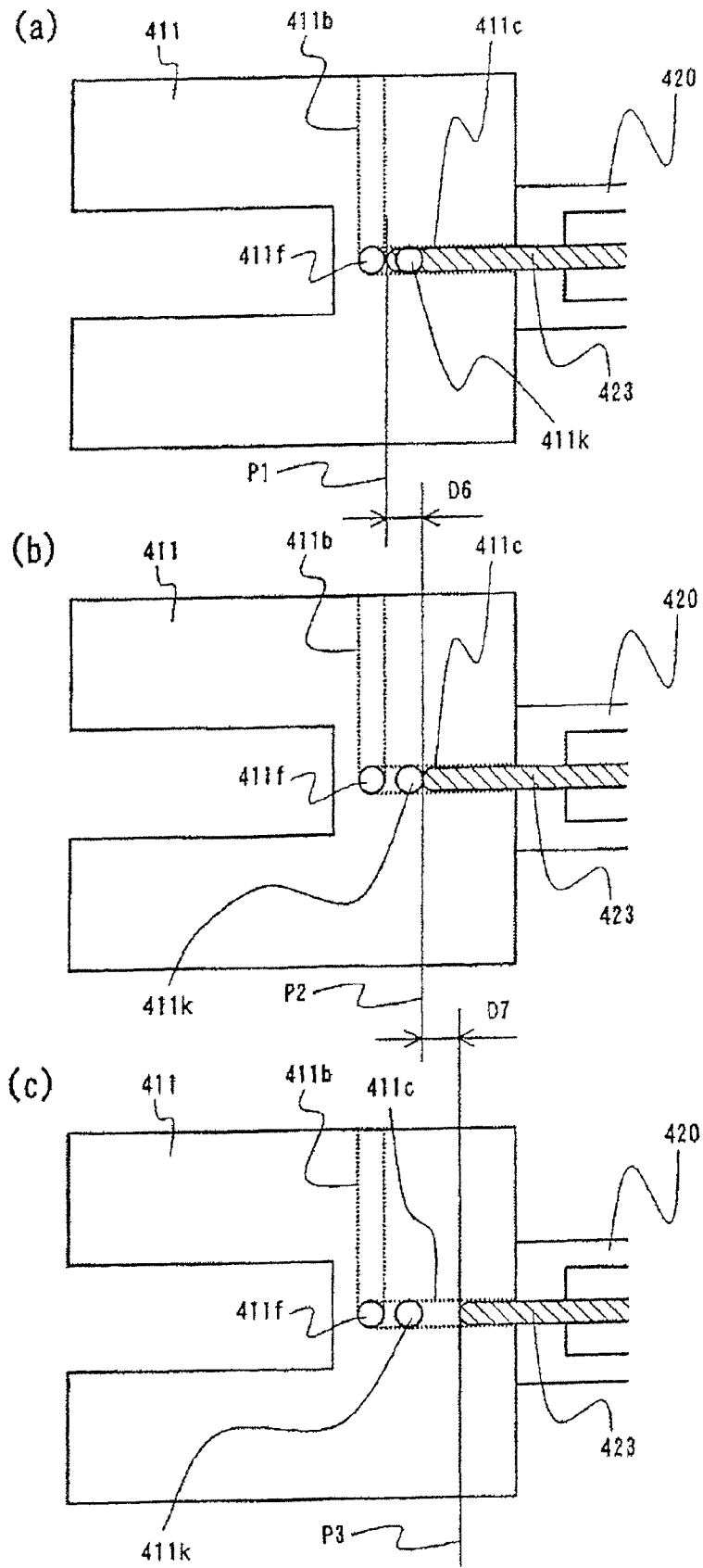
FIGS. 57(a)-57(c) are collectively a view showing the positional relationship between the first and second outlet openings and the first plunger of the nozzle body of FIG. 52.

FIGS. 57(a)-57(c) collectively are a view showing the positional relationship between the first outlet opening 411f and the second outlet opening 411k and the first plunger 423 of the nozzle body 411. FIG. 57(a) shows the state when the first plunger 423 extends and is at the first position P1. When the first plunger 423 is at the first position P1, the first plunger 423 blocks the second outlet opening 411k and allows hot melt to flow only to the first outlet opening 411f. Thus, hot melt is dispensed only from the first outlet opening 411f. The first outlet opening 411f communicates with the second cutout 413r2 of the shim plate 413 via the first vertical elongated bore 412d of the distribution plate 412. Therefore, hot melt can be dispensed onto only the end face 2e of the solar cell panel 2 from the first slot 413a1. More specifically, one-face coating can be performed.

FIG. 57(b) shows the state when the first plunger 423 retracts by a distance D6 from the first position P1 and is at the second position P2. The distance D6 is essentially equal to the distance between the center of the first outlet opening 411f and the center of the second outlet opening 411k. However, the distance D6 is not limited to this. For example, the distance D6 may be longer than the distance between the first outlet opening 411f and the second outlet opening 411k. Therefore, hot melt is dispensed from the first outlet opening 411f and the second outlet opening 411k. The second outlet opening 411k communicates with the third cutout 412r3 and fourth cutout 413r4 of the shim plate 413 via the vertical elongated bore 412a1, the upper lateral elongated bore 412a2, and the lower lateral elongated bore 412a3 of the distribution plate 412. Therefore, hot melt from the second outlet opening 411k can be coated onto the upper face 2t and lower face 2b of the solar cell panel 2 from the second slot 413a2 and the third slot 413a3. Hot melt from the first outlet opening 411f is dispensed on the end face 2e, so three-face coating can be performed.

FIG. 57(c) shows the state when the first plunger 423 retracts by a distance D7 from the second position P2 and is at the third position P3. The valve rod 35 of the hot melt supply valve 30 attached to the nozzle body 410 touches the valve seat 36, and dispensing of hot melt is prevented. In this state, the first plunger 423 is retracted from the second position P2 to the third position P3. The first plunger 423 improves termination when dispensing stops by sucking hot melt back into the cylinder 411c. The distance D7 is selected so as to expand the volume of the hot melt passage by exactly the appropriate amount.

Operation of Hot Melt Supply Valve and Inner Volume Control Valve

Figure 58:
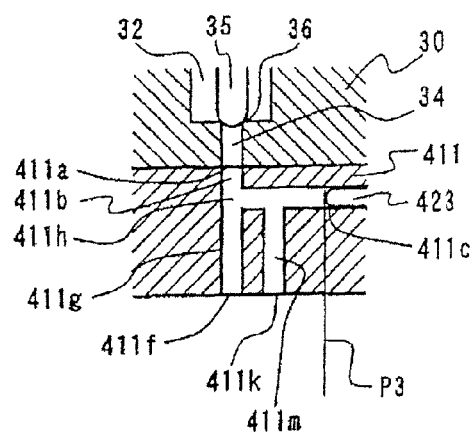
FIGS. 58(a)-58(c) are collectively an explanatory view showing the operation of the first plunger and the hot melt supply valve of the nozzle of FIG. 51.
Figure 58:
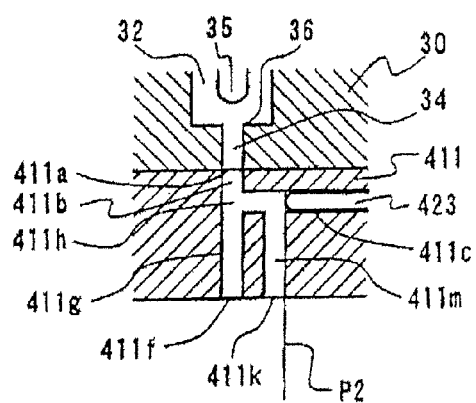
Figure 58:
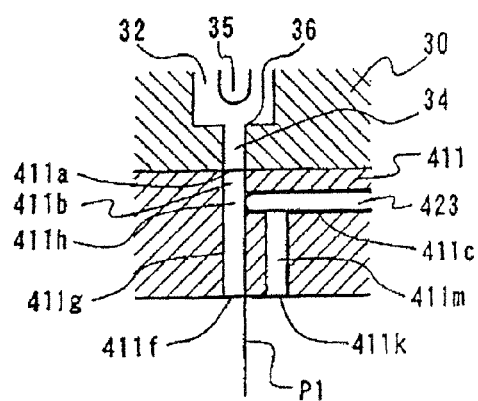

FIGS. 58(a)-58(c) collectively are an explanatory view showing the operation of the first plunger 423 and the hot melt supply valve 30 of the inner volume control valve 420 of the fourth embodiment. FIGS. 58(a)-58(c) schematically show the hot supply valve 30 and the nozzle body 411 for explanation.

FIG. 58(a) is a view showing the state before starting to dispense hot melt and after dispensing ends. One end of the valve rod 35 of the hot melt supply valve 30 touches the valve seat 36, and closes the dispensing port 34. Therefore, dispensing of hot melt inside the hot melt chamber 32 from the dispensing port 34 is prevented. The first plunger 423 of the inner volume control valve 420 is at the third position P3, the most pulled-back state.

FIG. 58(b) is a view showing the state during three-face coating of hot melt. The valve rod 35 of the hot melt supply valve 30 separates from the valve seat 36, and opens the dispensing port 34. At the same time, the first plunger 423 extends to the second position P2, and reduces the volume inside the cylinder 411c. Hot melt inside the hot melt chamber 32 is dispensed from the dispensing port 34 to the inlet opening 411a of the nozzle body 411. Hot melt passes through the first hot melt passage 411b, the junction 411h, and the second hot melt passage 411g, and is then dispensed from the first outlet opening 411f. Similarly, hot melt passes through the first hot melt passage 411b, the junction 411h, the cylinder 411c, and the third hot melt passage 411m, and is dispensed from the second outlet opening 411k. Therefore, hot melt is coated on the end face 2e, the upper face 2t, and the lower face 2b of the solar cell panel 2 from the first, second, and third slots 413a1, 413a2, and 413a3, respectively.

When starting three-face dispensing from the state shown in FIG. 58(a), the valve rod 35 separates from the valve seat 36 and opens the dispensing port 34; at the same time, the first plunger 423 extends from the third position P3 to the second position P2. When ending the dispensing, the valve rod 35 touches the valve seat 36 and closes the dispensing port 34; at the same time, the first plunger 423 retracts to the third position P3, increases the volume of the cylinder 411c, and sucks hot melt in the hot melt passage back into the cylinder 411c. This improves termination when dispensing ends.

FIG. 58(c) is a view showing the state during one-face coating of hot melt. The valve rod 35 of the hot melt supply valve 30 separates from the valve seat 36, and opens the dispensing port 34. At the same time, the first plunger 423 extends to the first position P1, and reduces the volume inside the cylinder 411c. Hot melt inside the hot melt chamber 32 is dispensed from the dispensing port 34 to the inlet opening 411a of the nozzle body 411. Hot melt passes through the first hot melt passage 411b, the junction 411h, and the second hot melt passage 411g, and is dispensed from the first outlet opening 411f. However, the third hot melt passage 411m is closed by the first plunger 423, so hot melt is not dispensed from the second outlet opening 411k.

When starting one-face dispensing from the state shown in FIG. 58(a), the valve rod 35 separates from the valve seat 36 and opens the dispensing port 34; at the same time, the first plunger 423 extends from the third position P3 to the first position P1. When starting one-face dispensing from the state shown in FIG. 58(b), the first plunger 423 extends from the second position P2 to the first position P1. When starting three-face dispensing from the state shown in FIG. 58(c), the first plunger 423 is retracted from the first position P1 to the second position P2. When ending dispensing from the state shown in FIG. 58(c), the valve rod 35 touches the valve seat 36 and closes the dispensing port 34; at the same time, the first plunger 423 retracts to the third position P3, increases the volume of the cylinder 411c, and sucks hot melt in the hot melt passage into the cylinder 411c. This improves termination when dispensing ends.

The multi-face coating device of the fourth embodiment is a three-face coating device with a variable coating range function. Below, the operation of a three-face coating device 401 with a variable coating range function will be described.

Before and after Dispensing, i.e. Coating Stopped State

Figure 59:
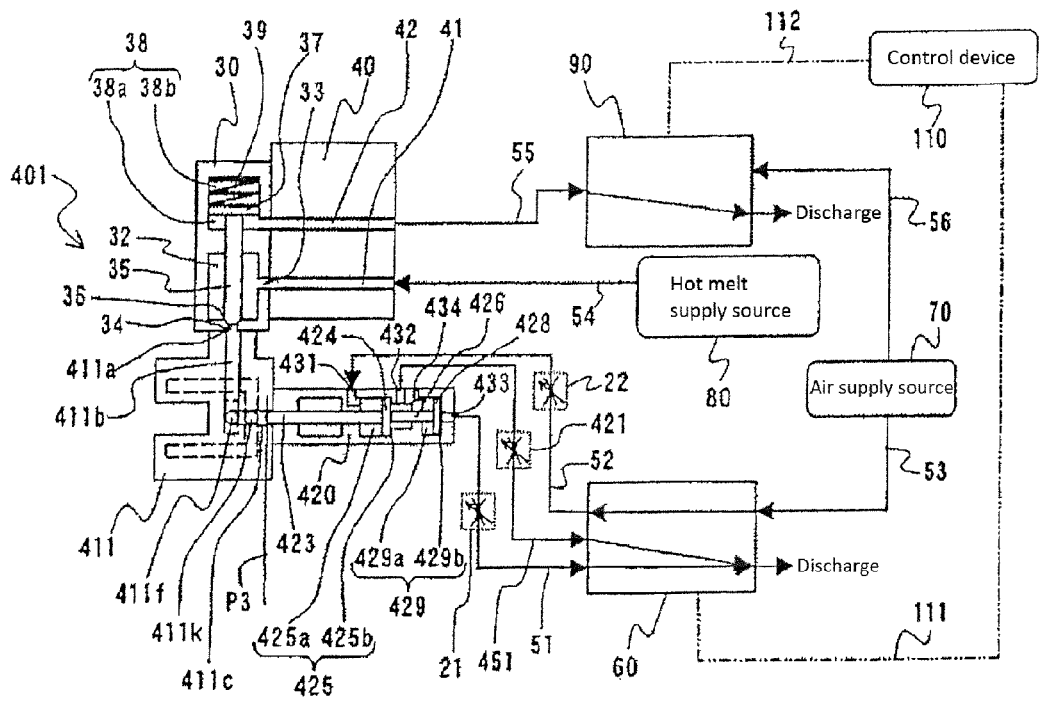
FIG. 59 is a view showing the inner volume control valve and hot melt supply valve of the nozzle of FIG. 51 between dispensing cycles.

FIG. 59 is a view showing the inner volume control valve 420 and the hot melt supply valve 30 before dispensing hot melt and after dispensing hot melt with the three-face coating device 401 of the fourth embodiment with a variable coating range function. The same elements as the three-face coating device 1 of the first embodiment are assigned the same reference numbers, and further explanation thereof is omitted.

In the hot melt coating stopped state, and more specifically, before and after dispensing hot melt, the valve air control circuit 60 supplies air to the first chamber 425a of the first piston 425 via the air passage 52, the speed controller 22, and the first inlet/outlet port 431. Meanwhile, air in the second chamber 425b of the first piston chamber 425 is delivered to the valve air control circuit 60 via the second inlet/outlet port 432, the speed controller 421, and the air passage 451, and is then exhausted to the atmosphere from the valve air control circuit 60. The pressure inside the first chamber 425a is higher than the pressure inside the second chamber 425b, so the first piston 424 moves so as to enlarge the first chamber 425a and shrink the second chamber 425b. The first piston 424 touches the second plunger 426 of the second piston 428. Air inside the second chamber 429b of the second piston chamber 429 is delivered to the valve air control circuit 60 via the third inlet/outlet port 433, the speed controller 21, and the air passage 51, and is then exhausted to the atmosphere from the valve air control circuit 60. Therefore, because of the movement of the first piston 424, the second piston 428 moves so as to enlarge the first chamber 429a of the second piston chamber 429 and shrink the second chamber 429b. Also, because of the movement of the first piston 424, the first plunger 423 retracts to the third position P3 inside the cylinder 411c of the nozzle body 411. At this time, the first plunger 423 sucks the hot melt that is in the hot melt passages 411b, 411g, and 411m back into the cylinder 411c.

Furthermore, the speed controllers 22 and 421, as aperture valves, control the movement speed of the first piston 424 by adjusting the flow of air. Similarly, the speed controller 21 controls the movement speed of the second piston 428 by adjusting the flow of air. Before and after dispensing hot melt, the gun air control circuit 90 releases air in the first chamber 38a of the piston chamber 38 to the atmosphere via the air passage 55 and the air passage 42 of the gun 40. The piston 37 is pushed by the energizing force of the spring 39, touches one end of the valve rod 35 to the valve seat 36, and closes the dispensing port 34. Therefore, dispensing of hot melt inside the hot melt chamber 32 from the dispensing port 34 is prevented.

During Three-Face Coating

Figure 60:
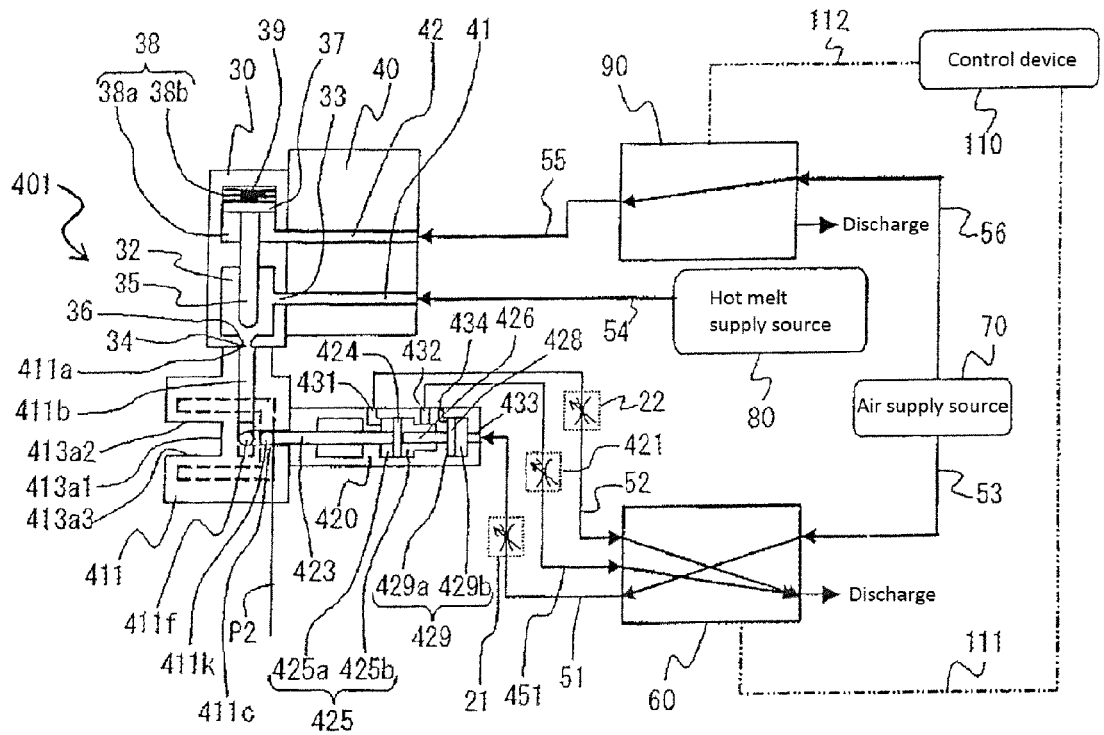
FIG. 60 is a view showing the inner volume control valve and hot melt supply valve of the nozzle of FIG. 51 during a dispensing cycle for applying liquid to three faces.

FIG. 60 is a view showing the inner volume control valve 420 and the hot melt supply valve 30 during three-face coating by the three-face coating device 401 of the fourth embodiment with a variable coating range function. During three-face coating, the control device 110 controls the valve air control circuit 60 using the first air control signal 111, and supplies air from the air supply source 70 to the air circuit 51. Air is supplied to the second chamber 429b of the second piston chamber 429 via the air passage 51, the speed controller 21, and the third inlet/outlet port 433. Meanwhile, the first chamber 429a of the second piston chamber 429 is always released to the atmosphere via the exhaust port 434. Therefore, the first chamber 429a shrinks and the second chamber 429b expands as the second piston 428 moves. Also, the valve air control circuit 60 releases air in the first chamber 425a and the second chamber 425b of the first piston chamber 425 to the atmosphere. Therefore, because of the movement of the second piston 428, the second plunger 426 pushes the first piston 424, and the first plunger 423 extends to the second position P2.

The control device 110 controls the gun air control circuit 90 using the second air control signal 112, such that the control rod 35 separates from the valve seat 36 and the dispensing port 34 opens. Hot melt in the hot melt chamber 32 is dispensed from the dispensing port 34 to the inlet opening 411a of the nozzle body 411. Hot melt passes through the first hot melt passage 411b, and is dispensed from the first outlet opening 411f and the second outlet opening 411k. Therefore, hot melt is coated on the end face 2e, the upper face 2t, and the lower face 2b of the solar cell panel 2 from the first slot 413a1, the second slot 413a2, and the third slot 413a3, respectively.

During One-Face Coating

Figure 61:
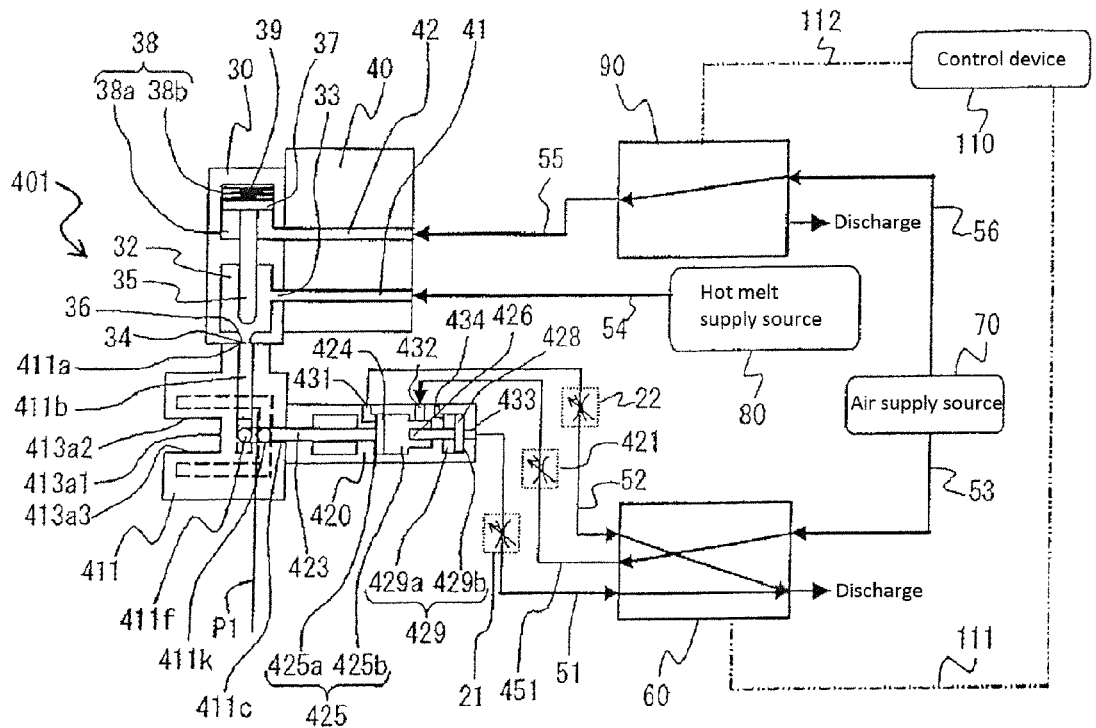
FIG. 61 is a view showing the inner volume control valve and hot melt supply valve of the nozzle of FIG. 51 during a dispensing cycle for applying liquid to one face.

FIG. 61 is a view showing the inner volume control valve 420 and the hot melt supply valve 30 during one-face coating by the three-face coating device 401 of the fourth embodiment with a variable coating range function. During one-face coating, the control device 110 controls the valve air control circuit 60 using the first air control signal 111, and supplies air from the air supply source 70 to the air circuit 41. Air is supplied to the second chamber 425b of the first piston chamber 425 via the air passage 451, the speed controller 421, and the second inlet/outlet port 432. Meanwhile, the first chamber 425a of the first piston chamber 425 is released to the atmosphere by the valve air control circuit 60. Therefore, the first chamber 425a shrinks and the second chamber 425b expands as the first piston 424 moves. Because of the movement of the first piston 424, the first plunger 423 extends to the first position P1. The first plunger 423 blocks the third hot melt passage 411m to the second outlet opening 411k of the nozzle body 411, so dispensing hot melt from the second outlet opening 411k is prevented. Hot melt is dispensed only from the first outlet opening 411f. Therefore, hot melt is dispensed only on the end face 2e of the solar cell panel 2 from the first slot 413a1.

Coating Methods

Figure 62:
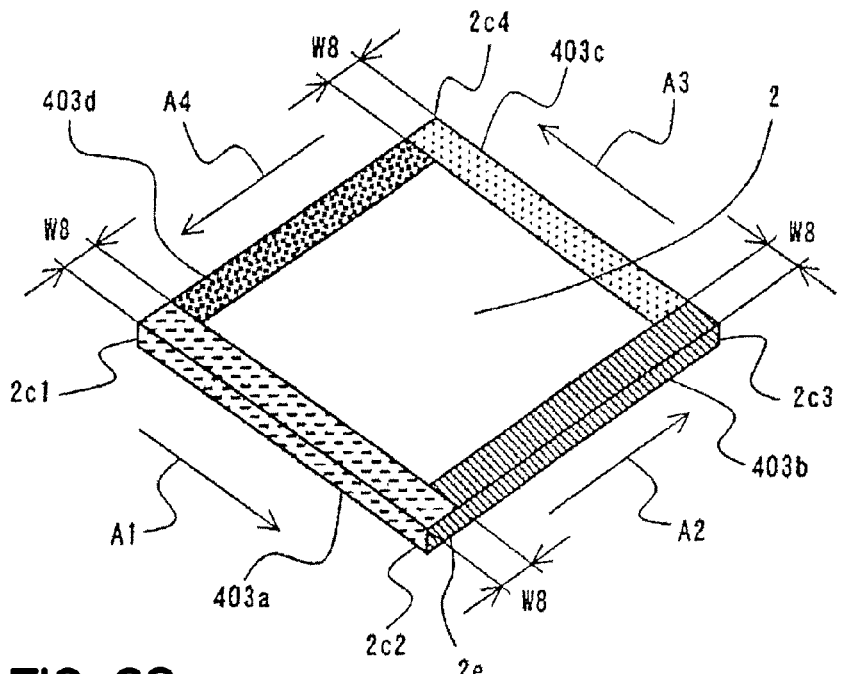
FIG. 62 is an explanatory view showing a method of coating a solar cell panel using a single coating device.
Figure 63:
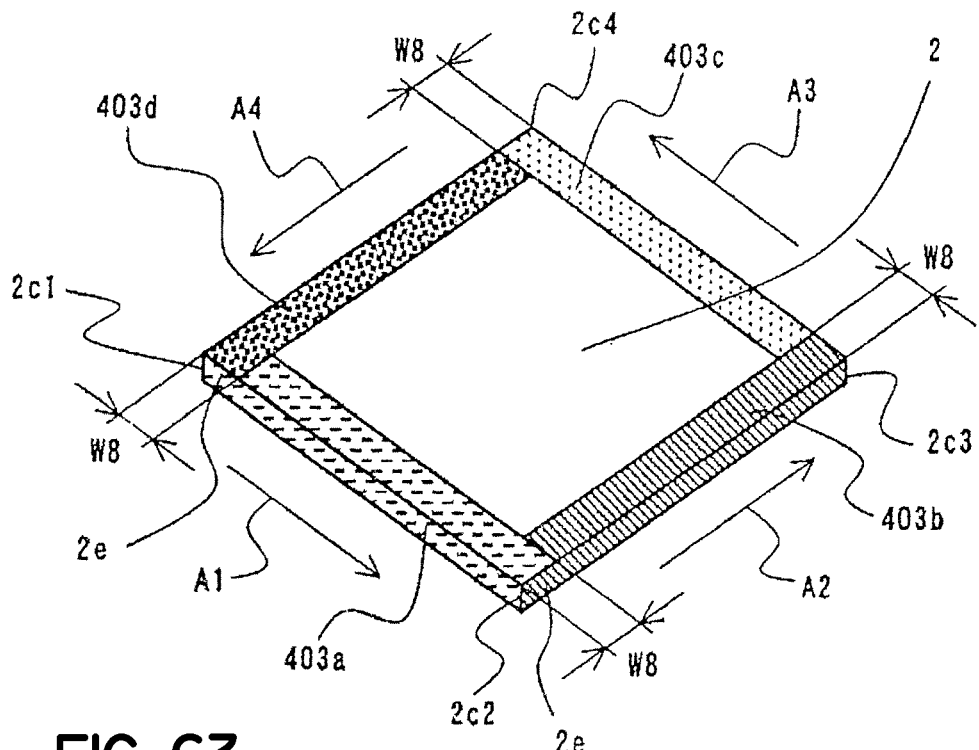
FIG. 63 is an explanatory view showing another method of coating a solar cell panel using a single coating device.
Figure 64:
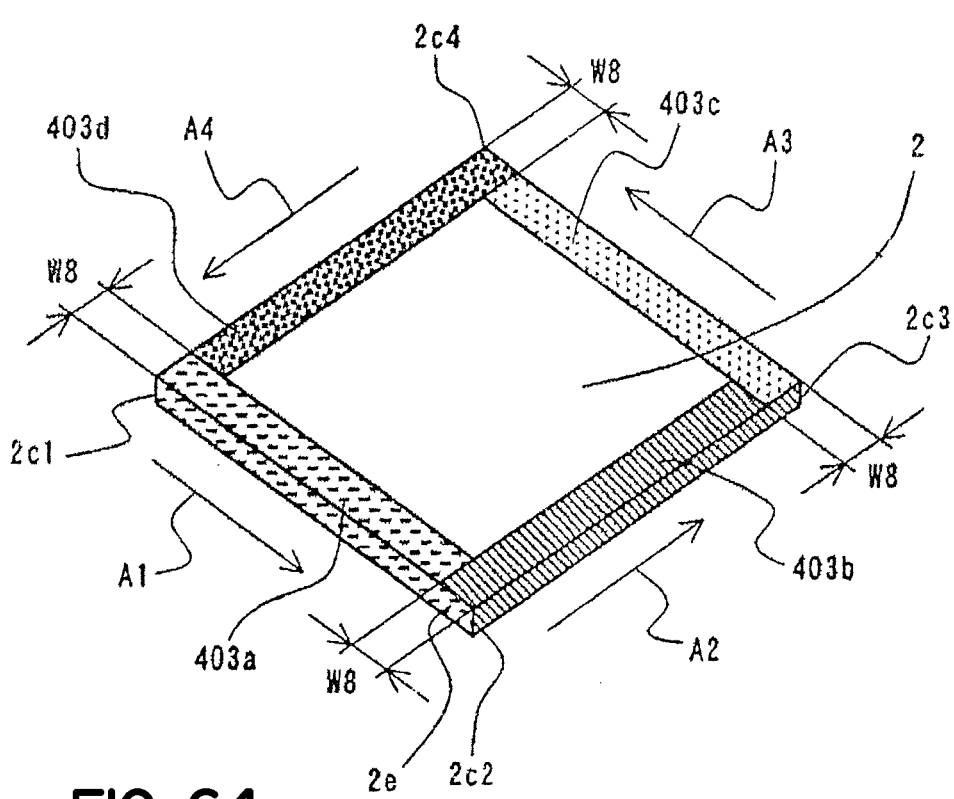
FIG. 64 is an explanatory view showing yet another method of coating a solar cell panel using a single coating device.

FIG. 62 to FIG. 64 are explanatory views showing methods of coating the solar cell panel 2 using the three-face coating device (hereinafter "coating device") 401 with a variable coating range function, mounted on a robot arm.

In the coating method shown in FIG. 62, at a corner 2c1 of the panel 2, the coating device 401 changes from the coating stopped state shown in FIG. 59 to the three-face coating state shown in FIG. 60. While the coating device 401 is moved in the direction indicated by arrow A1 by the robot arm, it coats hot melt 403a on the upper face, the end face, and the lower face of the panel 2 from the corner 2c1 to a corner 2c2. At the corner 2c2, the coating device 401 is temporarily in a coating stopped state. Next, when coating hot melt 403b from the corner 2c2 to a corner 2c3, the end face 2e of the corner 2c2 receives one-face coating for exactly the distance W8 so that hot melt is not coated so as to overlap on the upper face and the lower face of the corner 2c2. The distance W8 is the width of the coating film of hot melt dispensed on the upper face and lower face; the distance W8 is also the width W8 of the third and fourth cutouts 413r3 and 413r4 of the shim plate 413.

In this regard, the coating device 401 changes from the coating stopped state to the one-face coating state shown in FIG. 61 at the corner 2c2. While the coating device 401 is moved in the direction indicated by arrow A2 by the robot arm, it coats one face, the end face 2e of the panel 2, for exactly the distance W8. Then the coating device 401 goes into three-face coating and performs three-face coating until the corner 2c3. At the corner 2c3, the coating device 401 temporarily is in a coating stopped state. In the same manner, while being moved in the direction indicated by arrow A3 from the corner 2c3 to a corner 2c4, the coating device 401 performs one-face coating and three-face coating of hot melt 403c. When coating from the corner 2c4 to the corner 2c1, the coating device 401, while being moved in the direction indicated by arrow A4, performs one-face coating of hot melt 403d for exactly the distance W8 from the corner 2c4, and subsequently performs three-face coating. It switches to one-face coating before corner 2c1, and performs one-face coating for exactly the distance W8 to corner 2c1. Using the coating device 401 in this manner prevents hot melt from overlapping on the upper face and lower face at the corners 2c1, 2c2, 2c3, and 2c4.

FIG. 63 and FIG. 64 show other coating methods. In the coating method shown in FIG. 63, at the corner 2c1 of the panel 2, the coating device 401 changes from the coating stopped state shown in FIG. 59 to the one-face coating state shown in FIG. 61. While the coating device 401 is moved in the direction indicated by arrow A1 by the robot arm, the coating device 401 dispenses hot melt 403a on the end face 2e of the panel 2 for exactly a distance W8 from the corner 2c1. This procedure is performed to ensure coating without overlapping at the upper face and the lower face of the corner 2c1. After the distance W8 from the corner 2c1, the coating device 401 changes from the one-face coating state to the three-face coating state shown in FIG. 60, and dispenses hot melt 403a on the upper face, end face, and lower face of the panel 2. At the corner 2c2 the coating device 401 temporarily is in a coating stopped state. Next, when the coating device 401 coats from the corner 2c2 to the corner 2c3, the end face 2e of the corner 2c2 receives one-face coating with hot melt 403b for exactly a distance W8 so that hot melt is not overlapping at the upper face and the lower face of the corner 2c2. When the distance W8 is exceeded, the coating device 401 changes to three-face coating. In the same manner, when dispensing hot melt 403c from the corner 2c3 to the corner 2c4, the coating device 401 performs one-face coating for exactly a distance W8 from the corner 2c3 and then three-face coating for the remainder. When dispensing hot melt 403d from the corner 2c4 to the corner 2c1, the coating device 401 similarly performs one-face coating for exactly a distance W8 from the corner 2c4 and then three-face coating for the remainder. In this manner, hot melt coating is prevented from overlapping on the upper face and the lower face at the corners 2c1, 2c2, 2c3, and 2c4 of the panel 2.

In the coating method shown in FIG. 64, at the corner 2c1 of the panel 2, the coating device 401 changes from the coating stopped state shown in FIG. 59 to the three-face coating state shown in FIG. 60. The coating device 401, while being moved in the direction of arrow A1 by the robot arm, dispenses hot melt 403a on the upper face, the end face, and the lower face of the panel 2 from the corner 2c1 until a distance W8 before the corner 2c2. At the distance W8 before the corner 2c2, the coating device 401 changes from the three-face coating state to the one-face coating state shown in FIG. 61, and dispenses hot melt 403a only onto the end 2e of the panel 2 until the corner 2c2. At the corner 2c2, the coating device 401 temporarily is in a coating stopped state. Next, in the same manner, the coating device 401, while being moved in the direction of arrow A2, dispenses hot melt 403b on three faces from the corner 2c2 until a distance W8 before the corner 2c3, and during the distance W8 until the corner 2c3, the coating device 401 performs one-face coating of hot melt 403b. In the same manner, the coating device 401, while being moved in the direction of arrow A3, dispenses hot melt 403c on three faces from the corner 2c3 until a distance W8 before the corner 2c4, and during the distance W8 until the corner 2c4, the coating device 401 performs one-face coating of hot melt 403c. In the same manner, the coating device 401, while being moved in the direction of arrow A4, dispenses hot melt 403d on three faces from the corner 2c4 until a distance W8 before the corner 2c1, and during the distance W8 until the corner 2c1, the coating device 401 performs one-face coating of hot melt 403d. In this manner, hot melt coating is prevented from overlapping on the upper face and the lower face at the corners 2c1, 2c2, 2c3, and 2c4 of the panel 2.

Figure 65:
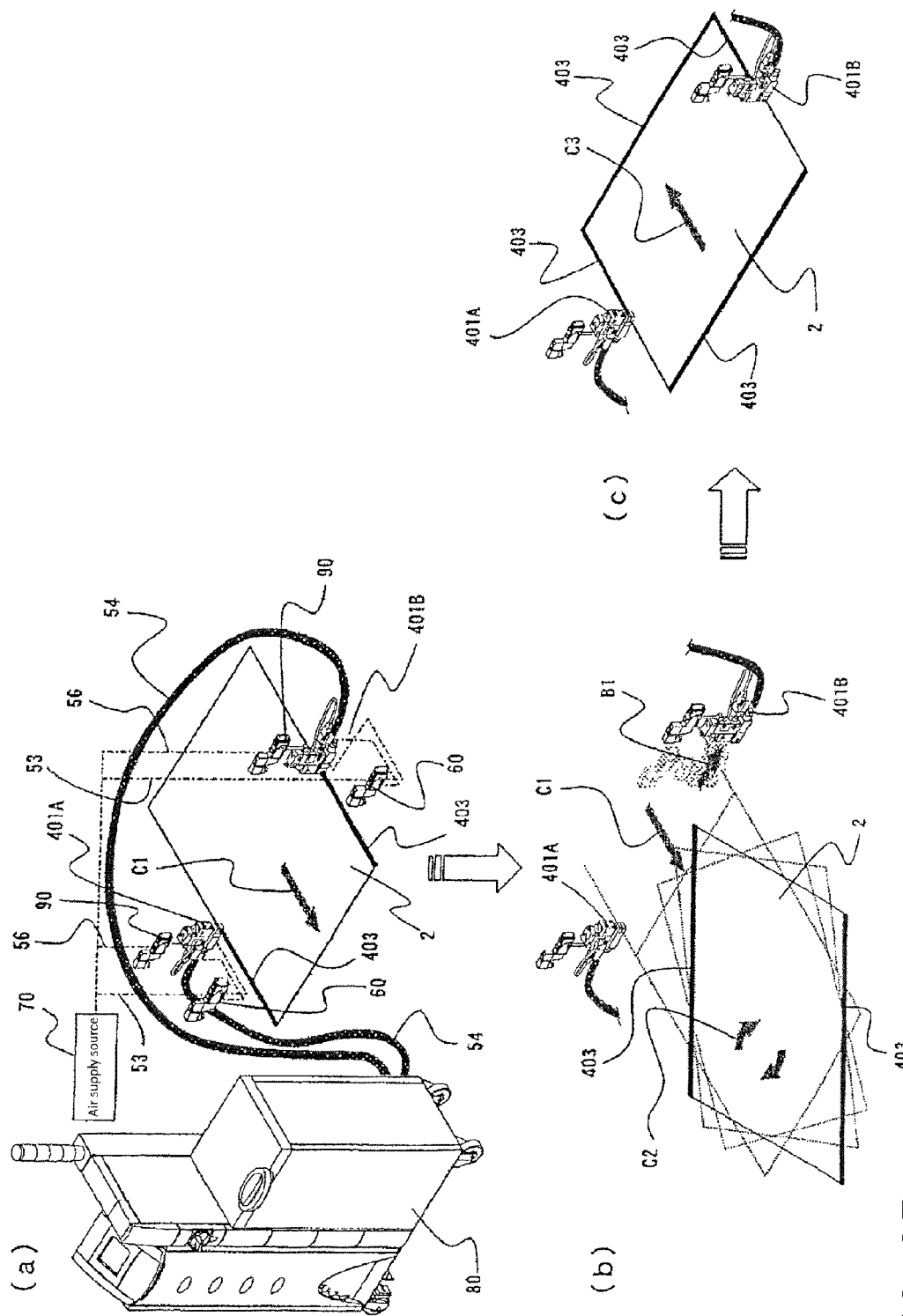
FIGS. 65(a)-65(c) are collectively an explanatory view showing a method of coating a solar cell panel using two coating devices.

FIGS. 65(a)-65(c) collectively are an explanatory view showing a method of performing coating using two three-face coating devices 401A and 401B with a variable coating range function. Hot melt 403 is simultaneously coated by the two coating devices 401A and 401B on two opposite edges of the solar cell panel 2. This operation can increase productivity. The two coating devices 401A and 401B are respectively connected to the hot melt supply source 80 by supply hot melt passages 54. The valve air control circuit 60 and the gun air control circuit 90 are respectively connected to the inner volume control valves and hot melt supply valves of the coating devices 401A and 401B. The valve air control circuit 60 and the gun air control circuit 90 are connected to the air supply source 70 by air passages 53 and 56, respectively.

As shown in FIG. 65(a), the two opposite edges of the solar cell panel 2 are respectively passed through the two coating devices 401A and 401B. While the solar cell panel 2 is moved in the direction of arrow C1, hot melt 403 is dispensed from the two coating devices 401A and 401B onto two opposite edges of the panel. When coating the two ends of the panel 2, the panel 2 is rotated 90° clockwise in the direction of arrow C2 as shown in FIG. 65(b). When doing so, it is necessary to ensure space for the panel 2 to rotate, so the coating device 401B may retract by moving in the direction indicated by arrow B1. Next, as shown in FIG. 65(c), the panel 2 is moved in the direction indicated by arrow C3. The direction indicated by arrow C3 is the opposite of the direction indicated by arrow C1. While the solar cell panel 2 is moved in the direction of arrow C3, hot melt 403 is dispensed from the two coating devices 401A and 401B onto another two opposite edges of the panel 2.

In this manner, panel coating is completed with two dispensing steps and one panel rotation step, so productivity can be increased. Furthermore, the step of dispensing hot melt onto another two opposite edges of the panel 2 is as follows: one-face coating of hot melt on only the panel end face from one corner of the panel to a first position separated by a width W8, which is the width of the hot melt coated on the panel face; and then three-face coating between the first position and a second position a width W8 before the other corner of the panel; and then one-face coating of hot melt on only the panel end face from the second position to the other corner of the panel.

Figure 66:
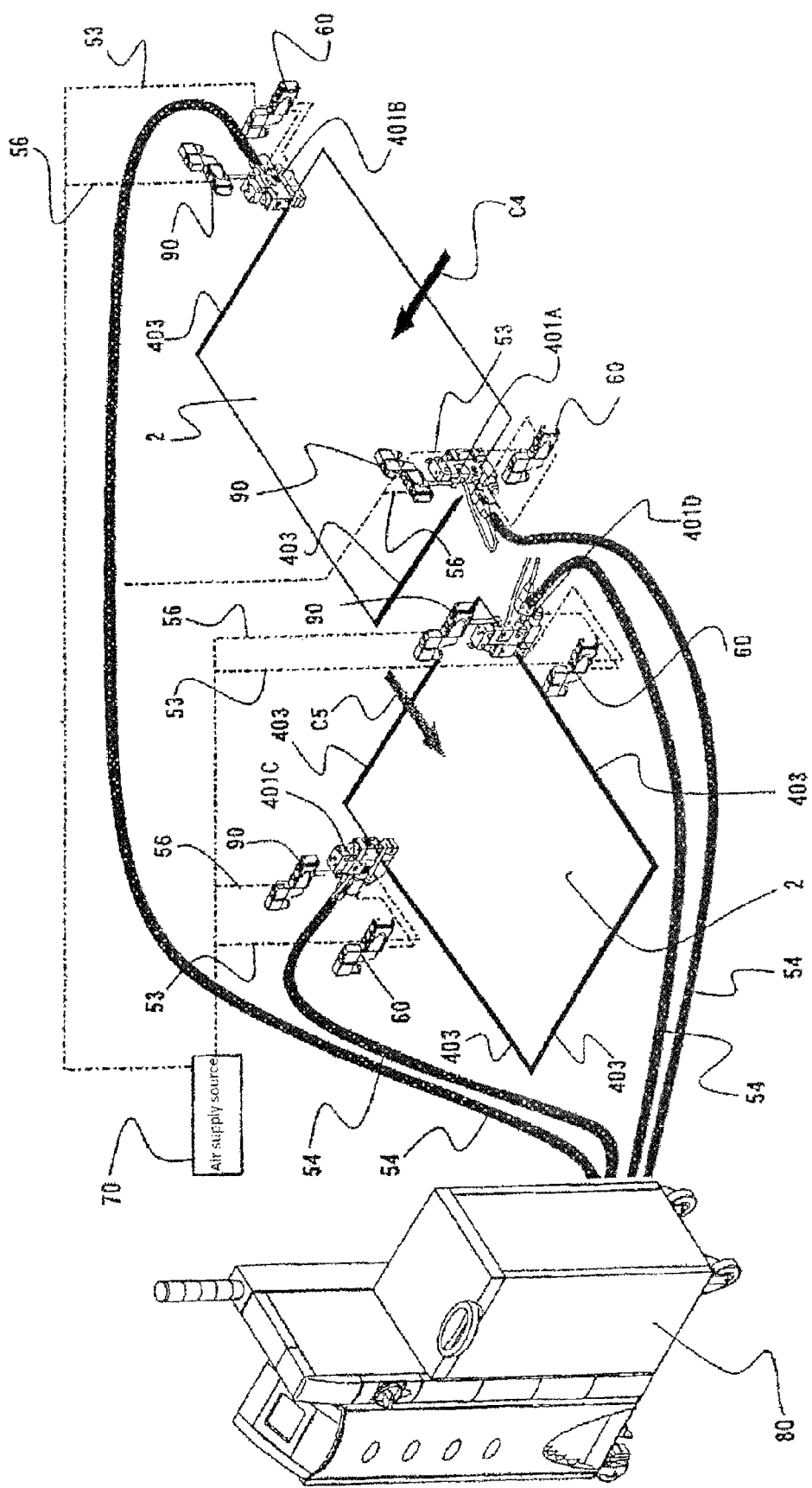
FIG. 66 is an explanatory view showing a method of coating a solar cell panel using four coating devices.

FIG. 66 is an explanatory view showing a method of performing coating using four three-face coating devices 401A, 401B, 401C, and 401D with a variable coating range function. Hot melt 403 is simultaneously coated by the two coating devices 401A and 401B on two opposite edges of the solar cell panel 2. Next, hot melt 403 is simultaneously coated by the two coating devices 401C and 401D on another two opposite edges of the panel 2. This operation can increase productivity.

The four coating devices 401A, 401B, 401C, and 401D are respectively connected to the hot melt supply source 80 by supply hot melt passages 54. The valve air control circuit 60 and the gun air control circuit 90 are respectively connected to the inner volume control valves and hot melt supply valves of the coating devices 401A, 401B, 401C, and 401D. The valve air control circuit 60 and the gun air control circuit 90 are connected to the air supply source 70 by air passages 53 and 56 respectively. As shown in FIG. 66, while the solar cell panel 2 is moved along a first path in the direction indicated by arrow C4, the two opposite edges of the panel 2 are respectively passed through the two coating devices 401A and 401B and hot melt 403 is dispensed on the two opposite edges of the panel 2 from the two coating devices 401A and 401B. When coating the two ends of the panel 2, the panel 2 is moved along a second path in the direction indicated by arrow C5, which is orthogonal to the direction indicated by arrow C4. In this regard, the second path is orthogonal to the first path. While the panel 2 is moved in the direction indicated by arrow C5, hot melt 403 is dispensed on another two opposite edges of the panel 2 from the two coating devices 401C and 401D.

In this manner, just by changing the movement direction of the panel, panel coating is complete with two dispensing steps, so productivity can be increased. Furthermore, the step of dispensing hot melt onto another two opposite edges of the panel 2 is as follows: one-face coating of hot melt on only the panel end face from one corner of the panel to a first position separated by a width W8, which is the width of the hot melt coated on the panel face; and then three-face coating between the first position and a second position a width W8 before the other corner of the panel; and then one-face coating of hot melt on only the panel end face from the second position the other corner of the panel.

The fourth embodiment included a coating device that used the inner volume control valve 420 capable of three-position control, with the three-face coating nozzle 410 as an example. However, the inner volume control valve 420 capable of three-position control may also be used in the two-face coating nozzle presented in the third embodiment. In this case, it is also possible to switch between one-face coating on the end face of the panel and two-face coating on the upper face and end face of the panel. Switching between one-face coating and two-face coating prevents hot melt from overlapping at the corners of the panel.

Also, an inner volume control valve capable of four-position or five-position or more position control may be provided by serially disposing two or more second plungers in the inner volume control valve 420 capable of three-position control. In this case, if the nozzle body, the distribution plate, and the shim plate are appropriately configured, hot melt may be dispensed in a controlled manner from many slots.

According to the embodiments of the present invention, it is possible to provide a multi-face coating nozzle that can dispense a liquid such as an adhesive or sealant at the end face of a substrate such as a solar cell panel and at two or more faces such as at the upper peripheral face and/or the rear peripheral face adjacent to the end face.

The present invention is not limited to the above embodiments. It can be practiced in various other configurations without departing from its characteristic matters. Therefore, the previously described embodiments are merely simple illustrative examples in every point, and are not to be interpreted as limiting. The scope of the present invention is as indicated by the claims, and is not restricted in any way by the specification body. In addition, variations and modifications that belong to the same scope as the claims are all within the scope of the present invention.

What is claimed is:

1. A coating nozzle for dispensing liquid onto a substrate including an end face and at least two additional faces adjacent to the end face, the coating nozzle comprising:
   a nozzle body including an inlet opening for receiving the liquid from a liquid supply valve, a first outlet opening, and a nozzle body cutout configured to receive at least a portion of the substrate;
   a distribution plate disposed adjacent to the nozzle body, the distribution plate including a first elongated bore in fluid communication with the first outlet opening and a distribution plate cutout aligned with the nozzle body cutout;
   a shim plate disposed adjacent to the distribution plate, the shim plate including a shim plate cutout aligned with the nozzle body cutout and in fluid communication with the first elongated bore in the distribution plate; and
   a baffle plate disposed adjacent to the shim plate, the baffle plate including a baffle plate cutout aligned with the nozzle body cutout,
   wherein at least a portion of the shim plate cutout is located between the first elongated bore in the distribution plate and the baffle plate so as to define a multi-face dispensing slot for dispensing the liquid onto at least two faces of the substrate.

2. The coating nozzle of claim 1, wherein the baffle plate cutout includes a first portion generally parallel to the substrate and a second portion adjacent to the first portion and generally inclined away from the substrate.

3. The coating nozzle of claim 1, further comprising:
   an attachment plate disposed adjacent to the baffle plate and configured to receive threaded fasteners for coupling the nozzle body, the distribution plate, the shim plate, the baffle plate, and the attachment plate together.

4. The coating nozzle of claim 1, wherein the baffle plate is configured to receive threaded fasteners for coupling the nozzle body, the distribution plate, the shim plate, and the baffle plate together.

5. The coating nozzle of claim 1, further comprising:
   a dispersion plate disposed between the distribution plate and the shim plate, the dispersion plate including a dispersion plate cutout aligned with the nozzle body cutout and a plurality of apertures configured to provide fluid communication between the first elongated bore in the distribution plate and the dispensing slot in the shim plate.

6. The coating nozzle of claim 1, wherein the first elongated bore of the distribution plate defines a U-shaped cross-section surrounding a portion of the distribution plate cutout, such that the dispensing slot is configured to dispense the liquid onto the end face and the at least two additional faces of the substrate simultaneously.

7. The coating nozzle of claim 1, wherein the first elongated bore of the distribution plate defines a L-shaped cross-section surrounding a portion of the distribution plate cutout, such that the dispensing slot is configured to dispense the liquid onto the end face and one of the additional faces of the substrate simultaneously.

8. The coating nozzle of claim 1, wherein the nozzle body further includes a first liquid passage portion extending from the inlet opening to a junction, a second liquid passage portion extending from the junction to the first outlet opening, and a cylinder communicating with the junction; and wherein the coating nozzle further comprises:
   an inner volume control valve including a plunger disposed for reciprocating movement within the cylinder between an extended position that reduces an effective volume of the cylinder in communication with the junction, and a retracted position that increases the effective volume of the cylinder in communication with the junction.

9. The coating nozzle of claim 1, wherein the nozzle body further includes a second outlet opening.

10. The coating nozzle of claim 9, wherein the first elongated bore of the distribution plate defines a linear cross-section adjacent to one side of the distribution plate cutout, such that the dispensing slot is configured to dispense the liquid entering the first elongated bore onto the end face of the substrate, and
   wherein the second elongated bore of the distribution plate defines a U-shaped cross-section surrounding a portion of the distribution plate cutout, such that the dispensing slot is also configured to dispense the liquid onto the end face and the at least two additional faces of the substrate simultaneously.

11. The coating nozzle of claim 9, wherein the first elongated bore of the distribution plate defines a linear cross-section adjacent to one side of the distribution plate cutout, such that the dispensing slot is configured to dispense the liquid entering the first elongated bore onto the end face of the substrate, and
   wherein the second elongated bore of the distribution plate defines a L-shaped cross-section surrounding a portion of the distribution plate cutout, such that the dispensing slot is configured to dispense the liquid onto the end face and one of the additional faces of the substrate simultaneously.

12. The coating nozzle of claim 9, wherein the nozzle body further includes a first liquid passage portion extending from the inlet opening to a junction, a second liquid passage portion extending from the junction to the first outlet opening, a cylinder communicating with the junction, and a third liquid passage portion communicating with the cylinder and the second outlet opening; and wherein the coating nozzle further comprises:
  an inner volume control valve including a plunger disposed for reciprocating movement within the cylinder between an extended position that reduces an effective volume of the cylinder in communication with the junction, and a retracted position that increases the effective volume of the cylinder in communication with the junction.

13. The coating nozzle of claim 12, wherein the plunger is movable between a first extended position that reduces an effective volume of the cylinder in communication with the junction and permits liquid flow through the second and third liquid passage portions, and a second extended position that further reduces an effective volume of the cylinder in communication with the junction and permits liquid flow through the second liquid passage portion while blocking fluid flow through the third liquid passage portion.

* * * * *